(12) United States Patent
Sakurai et al.

(10) Patent No.: US 6,495,807 B2
(45) Date of Patent: Dec. 17, 2002

(54) HEAT TREATING METHOD AND HEAT TREATING APPARATUS

(75) Inventors: Hideaki Sakurai, Yokohama (JP); Shinichi Ito, Yokohama (JP); Iwao Higashikawa, Tokyo (JP); Akitoshi Kumagae, Ichikawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/983,667

(22) Filed: Oct. 25, 2001

(65) Prior Publication Data

US 2002/0063123 A1 May 30, 2002

Related U.S. Application Data

(62) Division of application No. 09/666,108, filed on Sep. 20, 2000, now Pat. No. 6,333,493.

(30) Foreign Application Priority Data

Sep. 21, 1999 (JP) .......................................... 11-267654
Sep. 27, 1999 (JP) .......................................... 11-273213

(51) Int. Cl.⁷ ............................. H05B 3/02; H05B 3/68; C23C 16/00

(52) U.S. Cl. .................... 219/497; 219/502; 219/444.1; 118/725

(58) Field of Search ........................... 219/444.1, 446.1, 219/476, 477, 479, 480, 483, 497, 502, 508; 392/411, 412, 413; 118/724, 725

(56) References Cited

U.S. PATENT DOCUMENTS

| | | | | |
|---|---|---|---|---|
| 5,332,442 A | * | 7/1994 | Kubodera et al. | 118/725 |
| 5,504,831 A | * | 4/1996 | Sandhu et al. | 118/724 |
| 6,079,354 A | * | 6/2000 | Guo et al. | 118/719 |
| 6,121,579 A | * | 9/2000 | Aoki et al. | 118/730 |
| 6,259,072 B1 | * | 7/2001 | Kinnard et al. | 118/725 |
| 6,333,493 B1 | * | 12/2001 | Sakurai et al. | 118/725 |

* cited by examiner

Primary Examiner—Sang Paik
(74) Attorney, Agent, or Firm—Finnegan, Henderson, Farabow, Garrett & Dunner, L.L.P.

(57) ABSTRACT

Disclosed is a heat treating method for heating a target substrate by means of light irradiation, in which light irradiation treatment is applied to the target substrate such that the light irradiation regions of the target substrate do not overlap with each other, the light irradiation treatment being performed by using an irradiating light adjusted such that the distribution of the light intensity within the light irradiation region of the target substrate is rendered uniform.

3 Claims, 13 Drawing Sheets

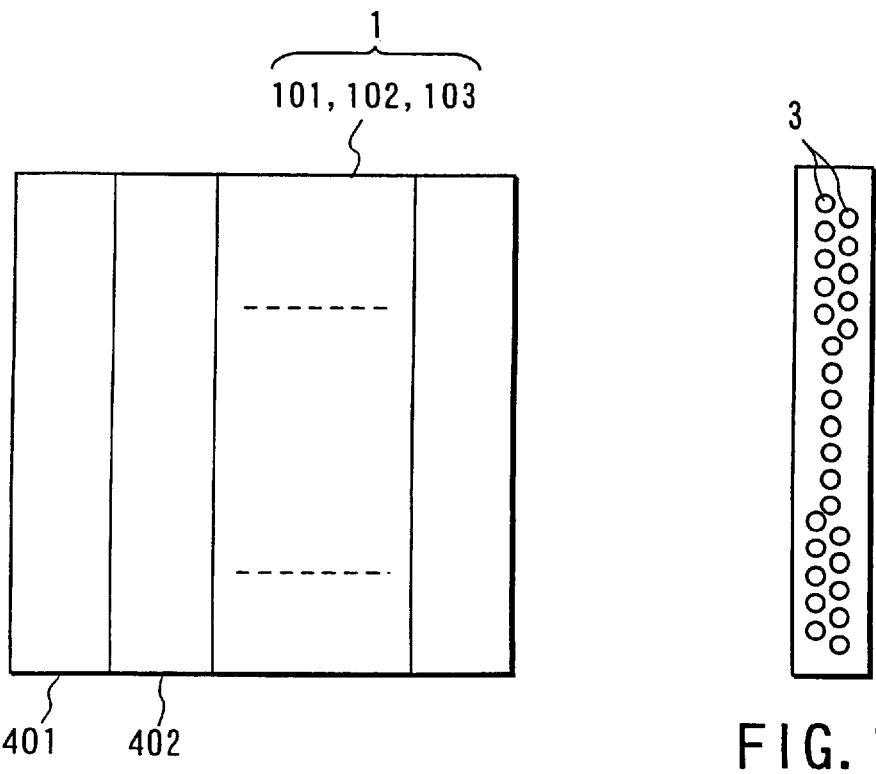
FIG. 13
FIG. 14
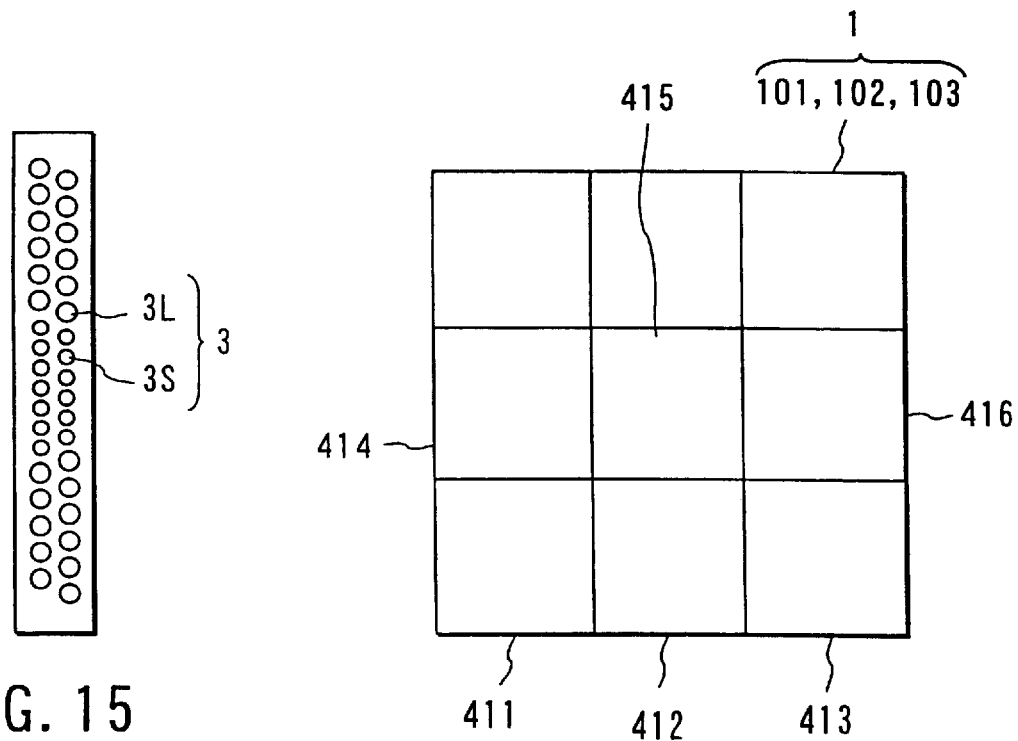
FIG. 15
FIG. 16

HEAT TREATING METHOD AND HEAT TREATING APPARATUS

This is a division of application Ser. No. 09/666,108, filed Sep. 20, 2000, now U.S. Pat. No. 6,333,493 which is incorporated herein by reference.

CROSS-REFERENCE TO RELATED APPLICATIONS

This application is based upon and claims the benefit of priority from the prior Japanese Patent Applications No. 11-267654, filed Sep. 21, 1999; and No. 11-273213, filed Sep. 27, 1999, the entire contents of which are incorporated herein by reference.

BACKGROUND OF THE INVENTION

The present invention relates to a heat treating method and a heat treating apparatus.

In the manufacture of a semiconductor device or a liquid crystal device, the nonuniformity in the temperature of resist or a base substrate in heating or cooling a target substrate to be processed is reflected on the nonuniformity in the size of the pattern. Thus, with miniaturization of the pattern, the temperature control of a higher precision is required.

For example, in a post exposure baking (PEB), which is one of the manufacturing steps of a photomask, the uniformity of the temperature within a plane of a photo mask blank is very important. It was customary in the past to employ a heating method using a heater in the PEB.

However, the following problem is generated in the heater heating system. Specifically, in the normal state, a good temperature uniformity is exhibited within a plane of a photo mask blank. However, in the transition period during which the photo mask blank is being heated, a temperature distribution is derived within a plane of the photo mask blank from the low heat conductivity and the large heat capacity of the quartz substrate, giving rise to a problem that the uniformity in the pattern size within the plane of the photo mask blank is made poor.

In view of the problem noted above, a lamp heating system is being studied. However, the following problem is generated in the case of the conventional lamp heating system. Specifically, in the lamp heating system, the uniformity of illuminance is poor within a lamp irradiating region, giving rise to a temperature drop in the boundary region between adjacent lamp irradiating regions. As a result, a temperature distribution is generated in the photo resist.

Also, in the lamp heating system, it is possible to heat selectively a target thin film to be heated such as resist or a light shielding film by selecting appropriately the wavelength of the light emitted from the lamp. However, since the target thin film is heated selectively, a large temperature difference is generated between the target thin film and the quartz substrate, making it difficult to perform the temperature control with a high accuracy.

BRIEF SUMMARY OF THE INVENTION

A first object of the present invention is to provide a heat treating method and a heat treating apparatus capable of making uniform the light intensity distribution caused by the light irradiation and also capable of making uniform the temperature distribution of a target substrate to be heated.

A second object of the present invention is to provide a heat treating method and a heat treating apparatus capable of performing the temperature control with a high accuracy.

According to a first aspect of the present invention, there is provided a heat treating method for heating a target substrate by means of light irradiation, wherein a light irradiation treatment is applied a plurality of times to the target substrate such that the adjacent light irradiating regions of the target substrate are allowed to partially overlap each other and that the light irradiating periods of the adjacent light irradiating regions do not overlap with each other.

In the first aspect of the present invention, it is desirable for the light irradiation treatment that is applied a plurality of times to the target substrate to be performed by changing the light irradiating regions by a predetermined order such that the adjacent light irradiating regions are allowed to partially overlap with each other.

In the first aspect of the present invention, it is desirable for the light irradiation treatment that is applied a plurality of times to the target substrate to be performed by a plurality of irradiating light generating sections arranged to conform with the light irradiating regions and arranged such that the adjacent light irradiating regions are allowed to partially overlap with each other.

In general, the light intensity in the peripheral portion of the light irradiating region is lower than that in the central portion. According to the first aspect of the present invention, it is possible to increase the light intensity in the peripheral portion (overlapping region) of the light irradiating regions so as to make the light intensity distribution uniform over the entire region of the substrate. Also, since the irradiating periods are not overlapped, the succeeding light irradiation can be performed after the temperature of the light irradiated region is lowered sufficiently. Where the light irradiating periods are allowed to overlap with each other, it is necessary to carry out a complex control in view of the effect of the heat from the adjacent light irradiating region. In the present invention, however, it is possible to suppress the effect of the heat from the adjacent light irradiating region, leading to a simple temperature control so as to make it possible to render easily the light intensity distribution uniform. It follows that, where the present invention is applied to the baking of, for example, a photo resist film, the distribution of energy imparted to the photo resist film can be made uniform, making it possible to pattern the photo resist film with a high accuracy.

According to a second aspect of the present invention, there is provided a heat treating method for heating a target substrate by irradiation with light, wherein a light irradiation treatment is applied to the target substrate such that the light irradiating regions of the target substrate do not overlap with each other, the light irradiation treatment being performed by using an irradiating light adjusted such that the distribution of the light intensity within the light irradiating region of the target substrate is rendered uniform.

In the second aspect of the present invention, it is desirable for the light irradiation treatment applied to the target substrate to be performed by changing the light irradiating regions by a predetermined order such that the light irradiating regions do not overlap with each other.

In the second aspect of the present invention, it is desirable for the light irradiation treatment applied to the target substrate to be performed by using a plurality of irradiating light generating sections arranged to conform with the light irradiating regions and arranged such that the light irradiating regions do not overlap with each other.

According to the second aspect of the present invention, used is an irradiating light adjusted to permit the light intensity distribution to be uniform and the light irradiating regions do not overlap with each other, making it possible to render the light intensity distribution uniform over the entire substrate. Also, the energy imparted to the substrate can be made uniform over the entire region of the substrate.

According to a third aspect of the present invention, there is provided a heat treating apparatus for heating a target substrate by means of light irradiation, comprising a substrate support section for supporting the target substrate, an irradiating light generating section for irradiating the light irradiating regions of the target substrate supported by the substrate support section, and a light irradiating region changing section for changing the light irradiating regions of the target substrate irradiated with the light generated from the irradiating light generating section.

According to a fourth aspect of the present invention, there is provided a heat treating apparatus for heating a target substrate by means of light irradiation, comprising a substrate support section for supporting the target substrate, a plurality of irradiating light generating sections arranged to conform with the light irradiating regions of the target substrate supported by the substrate support section and arranged such that the light irradiating regions do not overlap with each other, the irradiating light generating section generating an irradiating light adjusted to permit the light intensity distribution to be uniform within the light irradiating region of the target substrate.

According to a fifth aspect of the present invention, there is provided a heat treating method for heating a target substrate consisting of a base substrate and a thin film formed on the base substrate by a heating section, comprising the steps of detecting temperature information relating to temperature $T_1$ of the thin film and temperature $T_2$ of the base substrate, and controlling the heating section on the basis of temperature $T_1$ of the thin film, temperature $T_2$ of the base substrate, which are obtained from the temperature information, and a target temperature $T_s$ at which the thin film is to arrive.

Where a thin film formed on a base substrate is selectively heated, a large temperature difference tends to be generated between the thin film and the base substrate. According to the fifth aspect of the present invention, the heating section is controlled in view of the temperature $T_2$ of the base substrate in addition to the target temperature $T_s$ and the temperature $T_1$ of the thin film, with the result that the temperature control can be performed with a high accuracy even if there is a large temperature difference between the thin film and the base substrate.

In the fifth aspect of the present invention, it is desirable for a plurality of heating periods to be different from each other in the control characteristics of the heating section. Since the plural heating periods are made different from each other in the control characteristics, it is possible to perform the temperature control more accurately with the hunting suppressed.

Also, it is desirable for the control characteristics to be represented by a function including the temperature $T_1$ of the thin film and the temperature $T_2$ of the base substrate in at least one heating period.

Also, it is desirable for the control characteristics to be made different at time ta when, or before, the temperature $T_1$ of the thin film arrives at the target temperature $T_s$.

Also, it is desirable to determine the time $t_a$ by estimating the time when the temperature $T_1$ of the thin film will arrive at the target temperature $T_S$ of the thin film on the basis of the temperature $T_1$ of the thin film and the elevation rate of the temperature $T_1$ and by utilizing the result of the estimation.

According to a sixth aspect of the present invention, there is provided a heat treating apparatus for heating a target substrate consisting of a base substrate and a thin film formed on the base substrate, comprising a heating section for heating the target substrate, a temperature detecting section for detecting temperature information relating to temperature $T_1$ of the thin film and temperature $T_2$ of the base substrate, and a control section for controlling the heating section on the basis of the temperature $T_1$ of the thin film, the temperature $T_2$ of the base substrate, which are obtained from the temperature information detected by the temperature detecting section, and a target temperature $T_S$ at which the thin film is to arrive.

In the sixth aspect of the present invention, it is desirable for the temperature detecting section to have construction (1) or (2) given below:

(1) It is desirable for the temperature detecting section to have a first detecting section and a second detecting section each arranged on the side of that surface of the base substrate on which the thin film is formed, the first detecting section serving to detect a light having a wavelength Al that permits the temperature information of the thin film to be selectively obtained, and the second detecting section serving to detect a light having a wavelength B1 that permits the temperature information of at least the base substrate to be obtained. To be more specific, it is desirable for the first temperature detecting section to detect a light having a wavelength that is not transmitted through the thin film and for the second temperature detecting section to detect a light having a wavelength that is transmitted to some extent through the thin film and that is also transmitted to some extent through the base substrate.

(2) It is desirable for the temperature detecting section to have a first detecting section arranged on the side of a first surface of the base substrate on which the thin film is formed and a second detecting section arranged on the side of a second surface of the base substrate which is opposite to the first surface, the first detecting section serving to detect a light having a wavelength A2 that permits the temperature information of the thin film to be selectively obtained, and the second detecting section serving to detect a light having a wavelength B2 that permits the temperature information of at least the base substrate to be obtained. To be more specific, it is desirable for the first detecting section to detect a light having a wavelength that is not transmitted through the thin film, and for the second detecting section to detect a light of a wavelength that is transmitted to some extent through the base substrate.

The target substrate used in the present invention consists of, for example, a quartz substrate used as the base substrate and a photosensitive film such as a resist film and a light shielding film such as a chromium film used as the thin film.

In each of constructions (1) and (2) given above, the first temperature detecting section is arranged on the side of that surface of the base substrate on which the thin film is formed. Therefore, it is possible to obtain the temperature information of the thin film alone by setting the wavelength A1 or A2 to fall within an appropriate range. Also, in construction (1), the second temperature detecting section is arranged on the side of that surface of the base substrate on which the thin film is formed. Thus, it is possible to obtain the temperature information of the base substrate by setting the wavelength B1 to fall within an appropriate range, though the thin film is interposed between the second temperature detecting section and the base substrate. Also, in construction (2), the second temperature detecting section is arranged on the side of the second surface of the base substrate which is opposite to the first surface. Thus, the thin film is not interposed between the second temperature detecting section and the base substrate, making it possible to obtain the temperature information of the base substrate alone by setting the wavelength B2 to fall within an appropriate range.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13 is for explaining the heat treating method according to the second embodiment of the present invention;

FIG. 14 shows the layout of the light sources in the heat treating apparatus according to a first modification of the second embodiment of the present invention;

FIG. 15 shows the layout of the light sources in the heat treating apparatus according to a second modification of the second embodiment of the present invention;

FIG. 16 is for explaining the heat treating method according to a third modification of the second embodiment of the present invention;

DETAILED DESCRIPTION OF THE INVENTION

Some embodiments of the present invention will now be described with reference to the accompanying drawings.

[First Embodiment]

Figure 1:
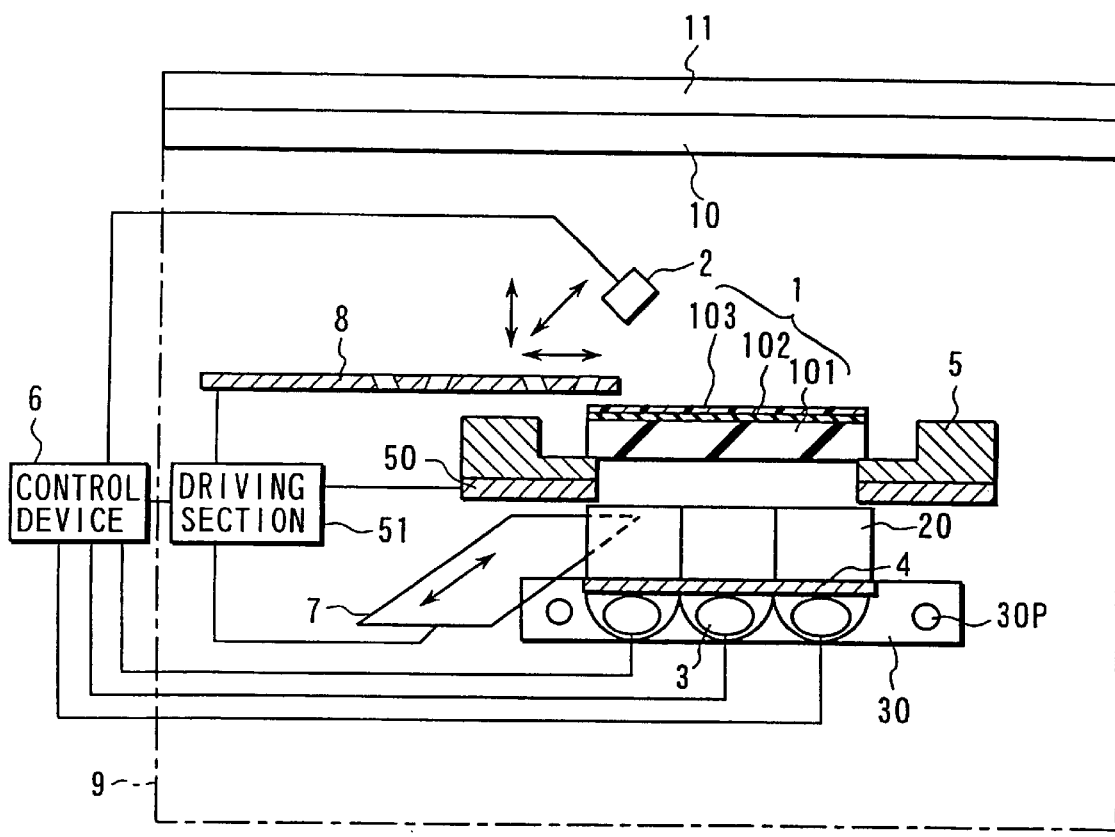
FIG. 1 schematically shows the construction of a heat treating apparatus according to a first embodiment of the present invention.

FIG. 1 schematically shows the construction of a heat treating apparatus according to a first embodiment of the present invention.

As shown in the drawing, a substrate 1 is arranged within the heat treating apparatus. A photo mask blank is used as the substrate 1. A post exposure baking is applied to the photo mask blank (substrate) 1 within the heat treating apparatus. The photo mask blank 1 consists of a transparent quartz glass substrate 101 and a light shielding film 102. A photoresist film 103 is formed on the light shielding film 102. The transparent quartz glass substrate 101 is sized at, for example, 6 inches and has a thickness of 0.25 inch. Also, the light shielding film 102 is of a laminate structure consisting of a Cr film and a $CrO_xN_y$ film.

An infrared ray sensor 2, which is arranged above the substrate 1 supported by a substrate support section 5, serves to detect the radiation from the substrate 1. Based on the result of the detection, the surface temperature of the substrate 1 is calculated by a control device 6.

A light source 3 is arranged below the substrate 1 supported by the substrate support section 5. Naturally, a heat treatment is applied to the substrate 1 by the light source 3 from the back side of the substrate 1. A halogen lamp having, for example, the maximum output of 300 W and the wavelength at the maximum output of 900 nm is used as the light source 3. A plurality of light sources 3, which are mounted to a light source support section 30, are equidistantly arranged in the X-direction and the Y-direction. In this embodiment, 9 light sources are arranged in total such that 3 light sources are arranged in each of the X- and Y-directions. A cooling water supply pipe 30P for circulating a cooling water is arranged within the light source support section 30. The light sources 3 and the surrounding regions are cooled by the cooling water circulated within the cooling water circulating pipe 30P.

A filter 4 and a light guide 20 are arranged between the light source 3 and the substrate support section 5. The filter 4 serves to cut the light having a wavelength of about 1.4 $\mu$m and the light having a wavelength not shorter than 2.2 $\mu$m, which are the wavelength of the light absorbed by the transparent quartz glass substrate 101.

The light guide 20, which is arranged for the every light source 3, is formed of, for example, a quartz glass rod (pillar) having a rectangular or square cross section. The light guide 20 is formed to output efficiently the light emitted from the light source 3 to the substrate 1. Incidentally, the light guide 20 may consist of a glass rod having a hexagonal cross section or a circular cross section in addition to the rectangular cross section noted above.

The substrate support section 5 is mounted on a stage 50 movable in an X-direction, a Y-direction and a Z-direction. The stage 50 can be moved in a predetermined direction by a driving section 51, and the driving section 51 is controlled by a control device 6.

The control device 6 is connected to the infrared ray sensor 2 and the light source 3. The voltage required for the light emission from the light source 3 is calculated in the control device 6 on the basis of the temperature information of the substrate 1 obtained by the infrared ray sensor 2, and the calculated voltage is outputted to the light source 3.

A transfer arm 7 and a flow regulating plate 8 are connected to the driving section 51. The transfer arm 7 serves to transfer the substrate 1 from outside the heat treating apparatus onto the substrate support section 5, and also serves to transfer the substrate 1 to which a heat treatment has been applied to the outside of the heat treating apparatus. On the other hand, the flow regulating plate 8, which serves to prevent disturbance of the gas stream above the substrate 1, can be moved by the driving section 51 in an X-direction, a Y-direction and a Z-direction.

These substrate support section 5, light source 3, infrared ray sensor 2, etc. are isolated from the outside by an apparatus outer frame 9 so as to form a measuring system in which the gas stream is not disturbed. A dust filter 10 and a chemical filter 11 are mounted to the apparatus outer frame 9 so as to control the dust and the atmosphere within the heat treating apparatus.

Incidentally, an exhaust duct (not shown) is connected to the heat treating apparatus. The gas generated during the heat treating operation is discharged to the outside through the exhaust duct, and the vapor of an organic material or the like is prevented by the exhaust duct from being attached to the inner wall of the heat treating apparatus.

The heat treating method using the heat treating apparatus shown in FIG. 1 will now be described.

In the first step, prepared is a photo mask blank consisting of the transparent quartz glass substrate 101 and the light shielding film 102 formed on the glass substrate 101, followed by coating the light shielding film 102 with the photoresist film 103. It is possible to use, for example, a positive chemically amplified resist film having a thickness of 500 nm as the photoresist film 103. Then, a light exposure treatment is applied to the photoresist film 103 by using an electron beam writing apparatus. The light exposure treatment is carried out under the conditions of, for example, 50 keV and 8 $\mu$C/cm$^2$.

In the next step, the position of the substrate 1 is determined by using a position aligning unit (now shown), followed by transferring the substrate 1 from outside the heat treating apparatus into the heat treating apparatus by operating the transfer arm 7. Also, the flow regulating plate 8 is arranged in an appropriate position above the substrate 1, e.g., in a position about 5 mm above the substrate 1. Further, the filter 4 is arranged in an appropriate position below the substrate 1. The temperature measurement by the infrared ray sensor 2 (which is a radiation thermometer) is started as soon as the substrate 1 is mounted to the substrate support section 5. A trigger signal for operating the infrared ray sensor 2 is delivered from the control device 6.

Figure 2:
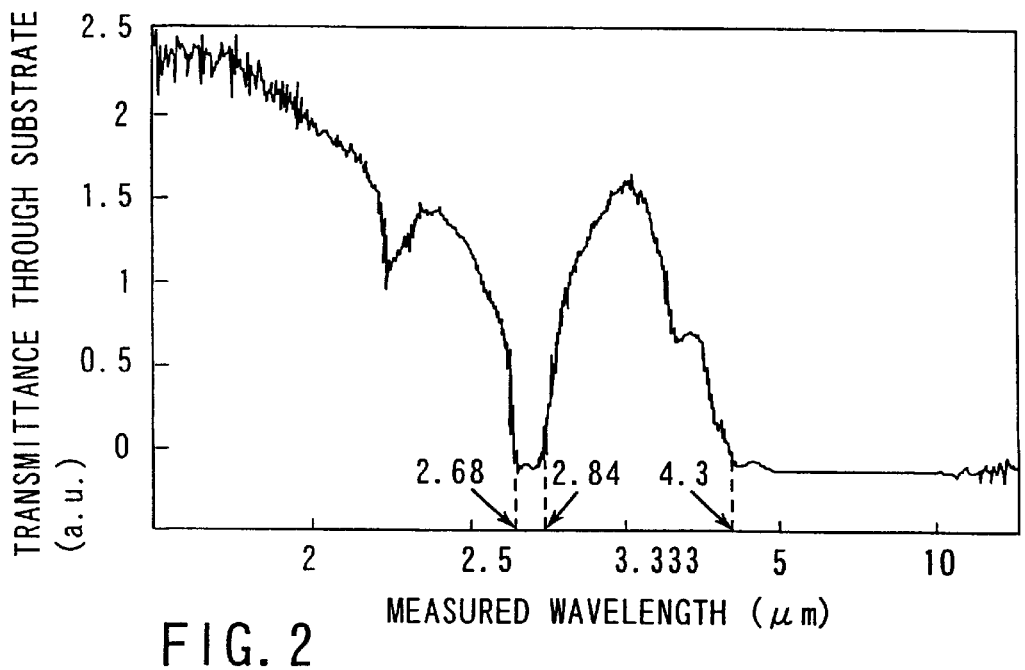
FIG. 2 is a graph showing the relationship between the wavelength and the substrate transmittance according to the first embodiment of the present invention.

The wavelength measured by the infrared ray sensor 2 is set at, for example, 11 $\mu$m. FIG. 2 is a graph showing the relationship between the measured wavelength and the transmittance of the substrate 1. As shown in FIG. 2, the transmittance of the substrate 1 is substantially zero in the wavelength range of about 2.7 $\mu$m to 2.8 $\mu$m and in the region of 4.3 $\mu$m or more. By selecting the wavelength at which the transmittance is substantially zero, the infrared ray sensor 2 is allowed to receive only the reflection from the photoresist film 103 and the light shielding film 102 that are to be measured. In addition, the infrared ray sensor 2 is allowed not to receive the radiation from the transparent quartz glass substrate 101 and from the light source 3, which are not the objects to be measured. Also, by measuring the wavelength of 11 $\mu$m on the long wavelength side, it is possible to avoid the influences of the spectral wavelength of water and carbon dioxide contained in the air atmosphere.

In the next step, the substrate 1 is disposed on the substrate support section 5, and the heating by the light source 3 is carried out a certainly period of time later. A low voltage of, for example, 1V is applied to the light source 3 in the initial state in order to prevent the light source 3 from being turned on or off completely so as to prolong the life of the light source 3.

Figure 3:
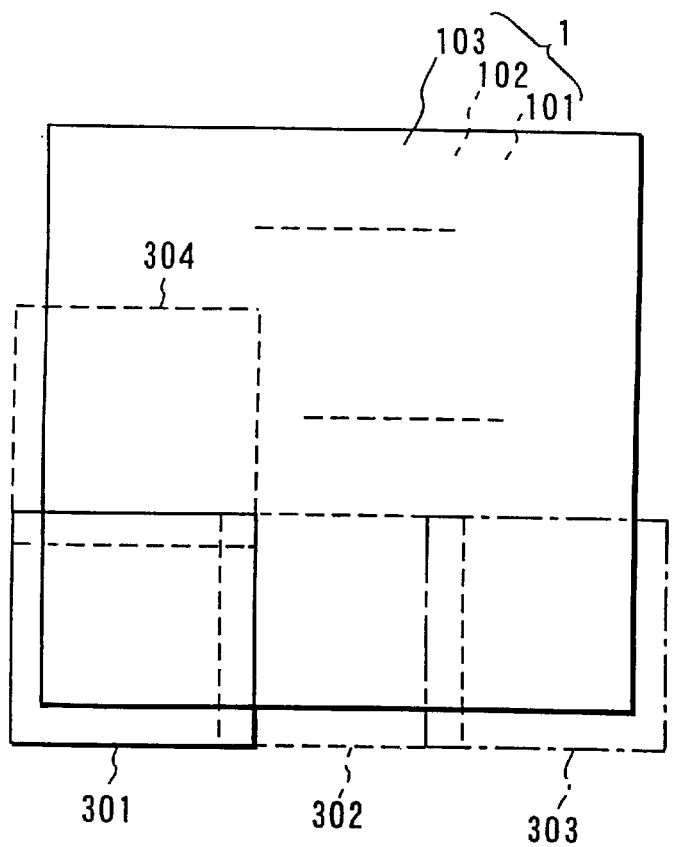
FIG. 3 shows the positional relationship between the heating region and the light irradiating region according to the first embodiment of the present invention.

Then, the light irradiation is carried out several times such that the adjacent light irradiating regions 301, 302, 303, 304, etc. are allowed to overlap with each other, and that the light irradiating periods do not overlap with each other so as to apply a heat treatment to the photoresist film 103 formed on the substrate 1, as shown in FIG. 3. The adjacent light irradiated regions overlap with each other, with the positions of the substrate 1 and the light source 3 held stationary.

Figure 4:
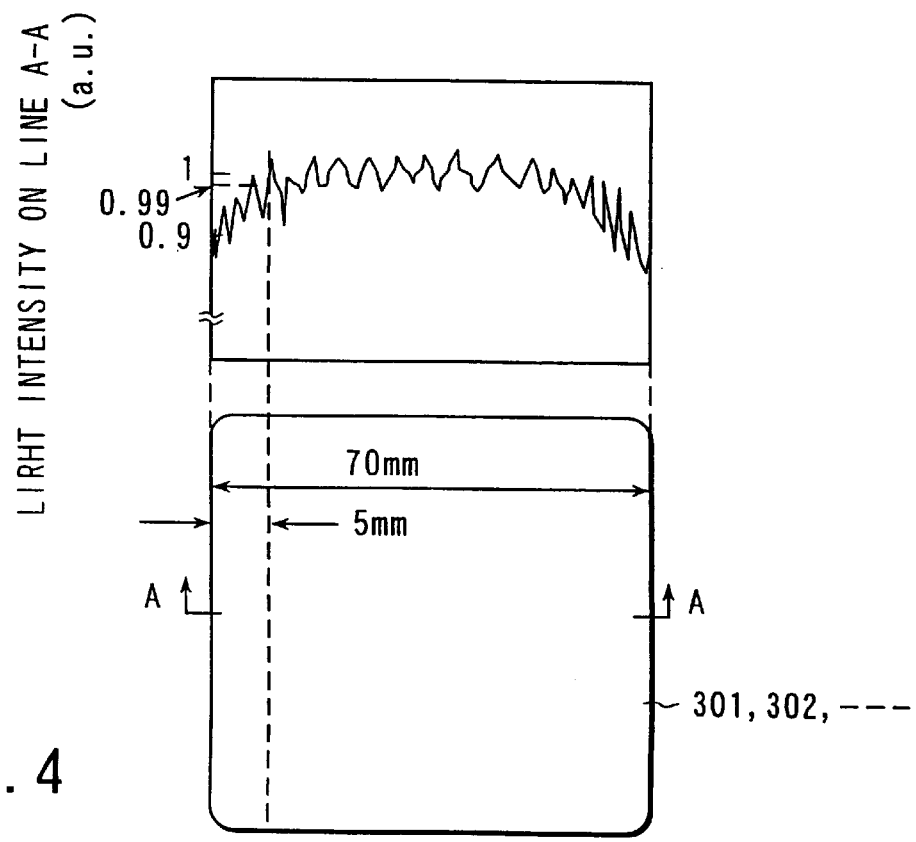
FIG. 4 shows the light intensity distribution within the light irradiating region according to the first embodiment of the present invention.

FIG. 4 is a graph showing the light intensity distribution of the light irradiation within the irradiated region on the substrate. As apparent from the graph of FIG. 4, the light intensity is high in the central region and low in the peripheral region in the light irradiated region, e.g., the light irradiated region 301. To be more specific, the light intensity in the outermost periphery of the light irradiated region 301 is lower by about 10% than the light intensity in the central portion of the light irradiated region 301. In this embodiment, each of the light irradiated regions 301, 302, 303, 304, etc. is square and has a size of 70 mm. Therefore, the light irradiation is carried out such that the light irradiated regions 301 and 302 are allowed to overlap with each other by about 5 mm so as to prevent the light intensity from being lowered in the overlapping region between the light irradiated regions 301 and 302. Incidentally, the decrease of the light intensity is not larger than 1% in the point about 5 mm inside the light guide 20 shown in FIG. 1.

The heat treating method will now be described. In the first step, the first light irradiation is performed so as to selectively heat the light irradiated region 301 alone of the photoresist film 103. When the temperature of the photoresist film 103 in the light irradiated region 301 is elevated to reach the temperature set in advance by the control device 6, the input voltage is controlled at an interval of 0.5 second so as to stabilize the temperature of the photoresist film 103.

Figure 5A:
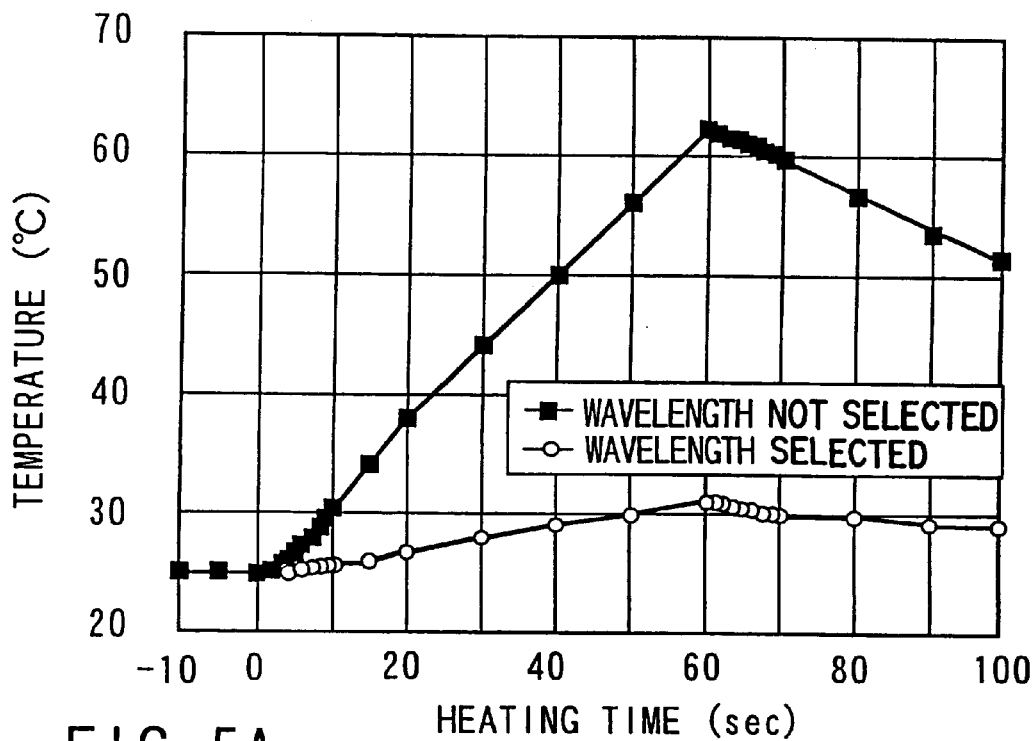
FIGS. 5A and 5B are graphs showing the temperature histories of the quartz glass substrate, the light shielding film and the photoresist film according to the first embodiment of the present invention.
Figure 5B:
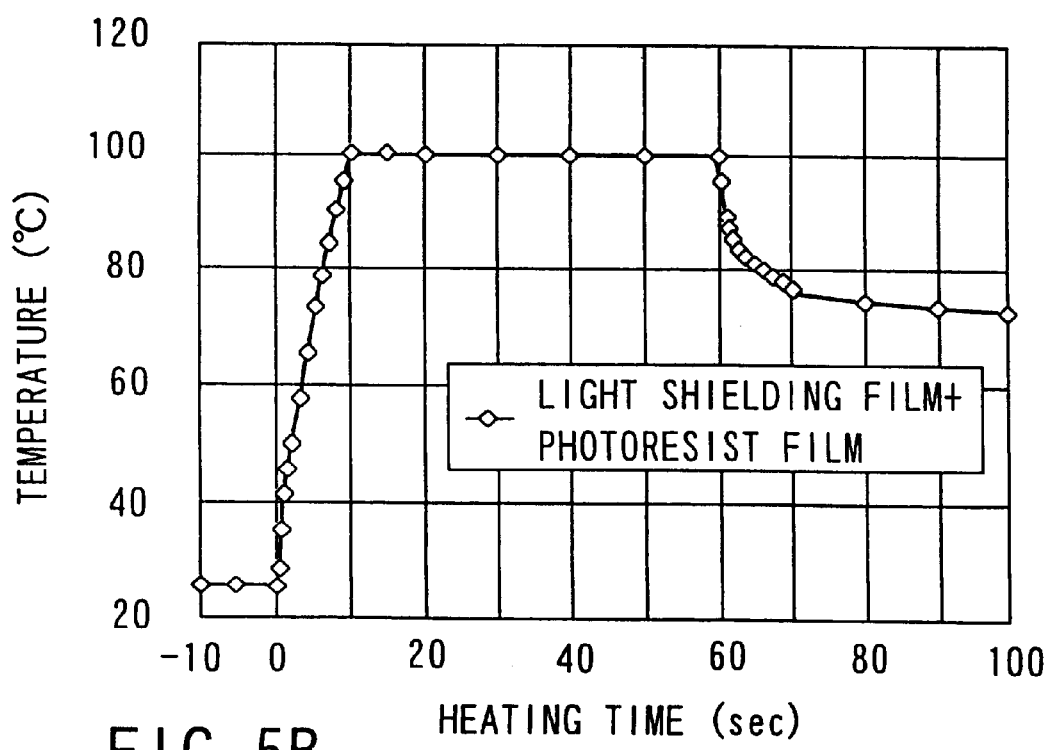

FIG. 5A shows the temperature history of the quartz glass substrate 101, with FIG. 5B showing the temperature histories of the light shielding film 102 and the photoresist film 103.

As shown in FIG. 5B, the temperature of the light shielding plate 102 is elevated to reach 100° C. in about 10 seconds after start-up of the light irradiation. Then, the light irradiation is controlled by the control device 6 such that the temperature of the light shielding film 102 is made constant at 100° C. After the heat treatment by the light irradiation is performed for 60 seconds, the voltage applied to the light source 3 is lowered to a low voltage so as to stop the heat treatment by the light irradiation. As shown in FIG. 5A, the temperature of the transparent quartz glass substrate 101 in this step is about 31° C., supporting that the temperature elevation of the transparent quartz glass substrate 101 can be suppressed in the case of using the filter 4, compared with the temperature of about 62° C. in the case where the filter 4 is not used. The substrate 1 is cooled by stopping the heat treatment.

As shown in FIGS. 6A to 6D, a heat treatment can be applied effectively to the light shielding film 102 and the photoresist film 103 while suppressing the temperature elevation of the transparent quartz glass substrate 101 by setting the wavelength of the light source 3 at 1.3 μm or less or to fall within a range of between 1.5 μm and 2.1 μm.

Figure 6A:
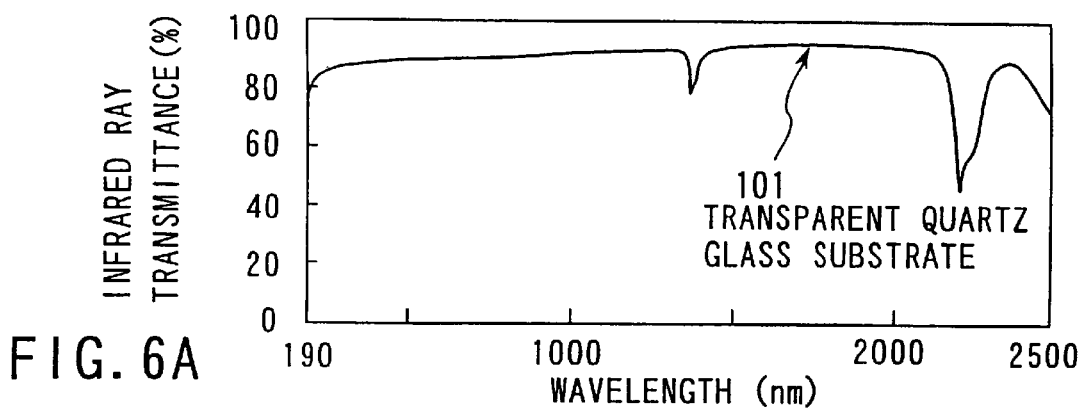
FIGS. 6A to 6D show the transmittance and reflectance of an infrared ray according to the first embodiment of the present invention.
Figure 6B:
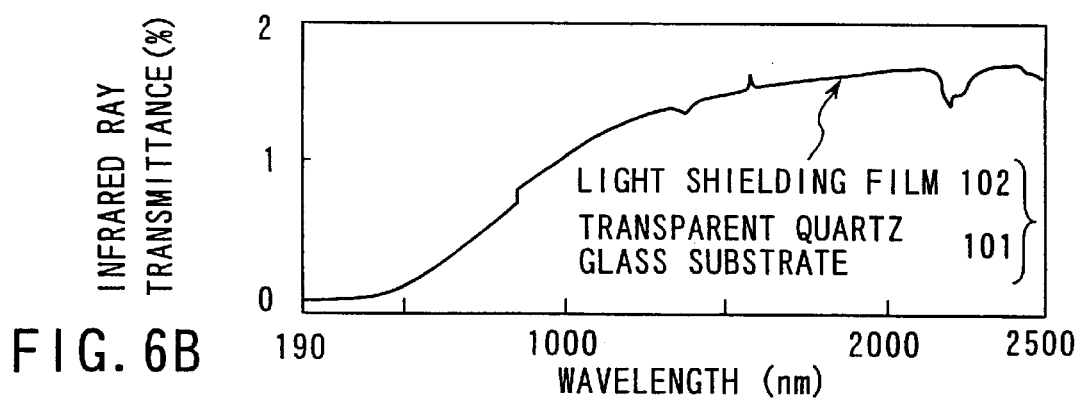
Figure 6C:
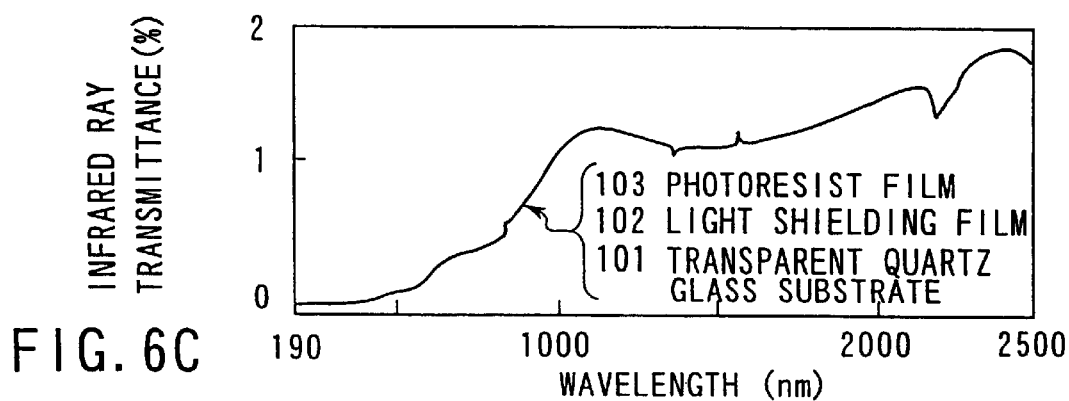

FIG. 6A is a graph showing the relationship between the wavelength of the light source 3 and the infrared ray transmittance in respect of the transparent quartz glass substrate 101. FIG. 6B is a graph showing the relationship between the wavelength of the light source 3 and the infrared ray transmittance in respect of the transparent quarts substrate 101 having the light shielding film 102 formed thereon. FIG. 6C is a graph showing the relationship between the wavelength of the light source 3 and the infrared ray transmittance in respect of the transparent quartz glass substrate 101 having the light shielding film 102 and the photoresist film 103 formed thereon. Further, FIG. 6D is a graph showing the relationship between the wavelength of the light source 3 and the infrared ray reflectance in respect of the transparent quarts glass substrate 101 having the light shielding film 102 and the photoresist film 103 formed thereon.

As shown in FIG. 6A, in the transparent quartz glass substrate 101 used in this embodiment, the wavelength region absorbing the light is present in the wavelengths of about 1.4 μm and not shorter than 2.2 μm. In the other wavelength region, the transmittance is about 90% and the remaining 10% of the light is almost reflected, with the result that the infrared ray is scarcely absorbed. It follows that the transparent quartz glass substrate is very unlikely to be heated.

The infrared ray transmitting through the transparent quartz glass substrate is incident on the light shielding film formed on the transparent quartz glass substrate 101. As shown in FIG. 6B, the light transmittance tends to gradually increase with increase in the wavelength. However, because of the presence of the light shielding film 102, the light transmittance is about 1% in a wavelength of 1 μm. Since the transmittance is increased with increase in the wavelength, it is desirable to use the light having the wavelength of about 1 μm or shorter.

Figure 6D:
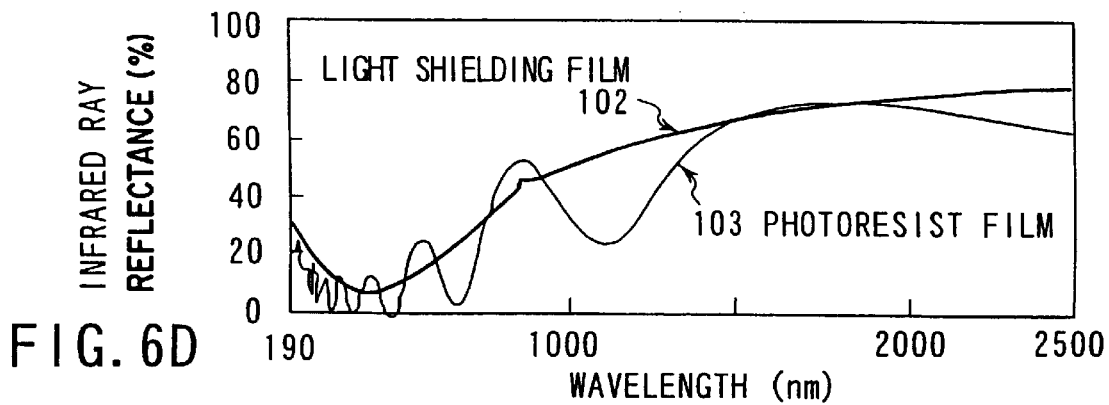

As shown in FIG. 6D, the reflectance of the transparent quartz glass substrate 101 having the light shielding film 102 formed thereon is about 50% in the wavelength of 1 μm. Therefore, the remaining 50% is supposed to have been absorbed by the light shielding film 102.

As shown in FIGS. 6B and 6C, the transparent quartz glass substrate having the photoresist film 103 formed thereon exhibits the transmittance of the light having a wavelength of about 1.1 μm, which is about 0.5% higher than that of the transparent quartz glass substrate 101 not having the photoresist film 103 formed thereon. Since the reflectance of the light having a wavelength of about 1.1 μm is about 30% as shown in FIG. 6D, it is highly possible for the photoresist film 103 to absorb the light having the wavelength of about 1.1 μm.

As described above, where the filter 4 is arranged between the substrate 1 and the light source 3, it is possible to heat selectively the light shielding film 102 and the photoresist film 103 upon irradiation with the infrared ray without heating the transparent quartz glass substrate 101.

After the heat treatment (first light irradiation) applied to the light irradiated region 301, the second light irradiation is applied to the light irradiated region 302 by the light source 3 differing from the light source 3 used for the first light irradiation, with the positional relationship between the substrate 1 and the light source 3 left unchanged. After the light source 3 used for the first light irradiation is turned off, the light source 3 used for the second light irradiation is turned on. The second light irradiation is started when the substrate 1 is cooled to, for example, room temperature. What should be noted is that the first light irradiation and the second light irradiation do not overlap with each other in the irradiating time such that the irradiating time for the second light irradiation deviates from the irradiating time for the first light irradiation.

Figure 7A:
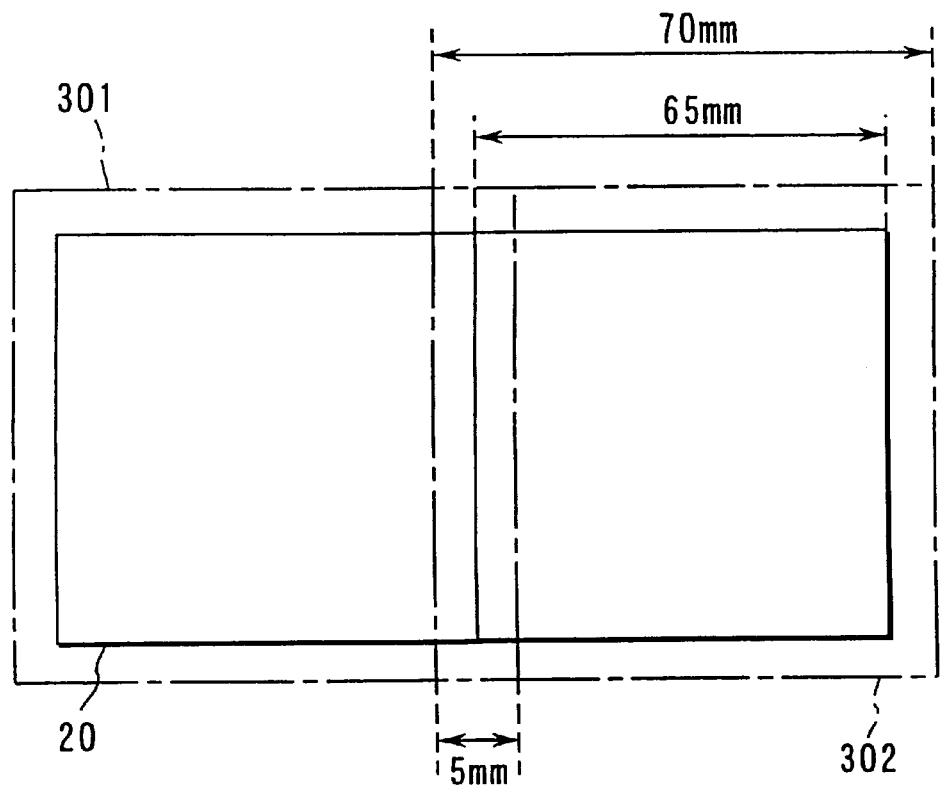
FIGS. 7A and 7B show the positional relationship between adjacent light irradiating regions according to the first embodiment of the present invention.
Figure 7B:
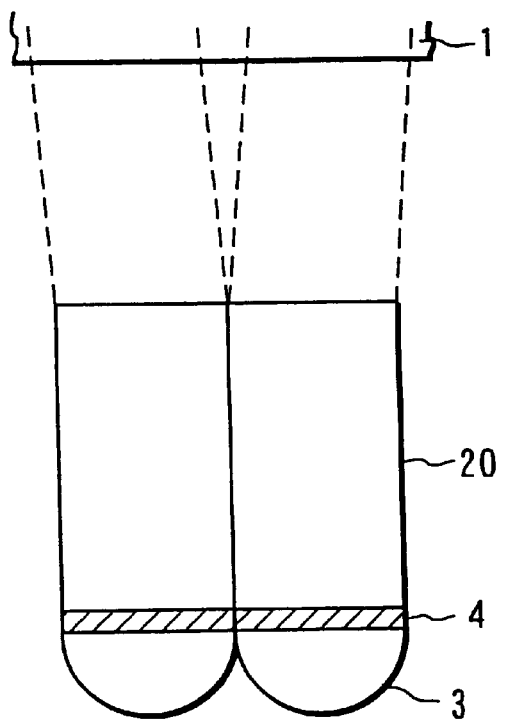

FIGS. 7A and 7B show the relationship between the first light irradiation and the second light irradiation. As shown in FIGS. 7A and 7B, the light rays emitted from the adjacent light guides 20 are allowed to overlap with each other. In this embodiment, the size of each light guide 20 is 65 mm square, and the size of the region irradiated with the light emitted from the light guide 20 is 70 mm square, as shown in FIG. 7A. It follows that the overlapping width of the adjacent light irradiated. regions is 5 mm. The overlapping region, which is provided so as to make the irradiated energy uniform over the entire region of the photoresist film 103, is determined in view of the heating time of the substrate 1 and the thermal diffusion of the light shielding film 102.

The infrared ray sensor 2 is moved to a position conforming with the light irradiated region 302 before the second light irradiation is performed.

In the fashion described above, the third light irradiation to the ninth light irradiation are carried out successively by the light source 3 so as to apply the heat treatment to the light irradiated regions 303, 304, etc. as shown in FIG. 3, with the positional relationship between the substrate 1 and the light source 3 left unchanged, thereby applying the heat treatment to the entire region of the photoresist film 103.

In the next step, a dip development is applied to the substrate 1 after the post exposure baking so as to form an etching mask consisting of the photoresist film 103. It is possible to use, for example, "AD-10" (trade name of a developing solution manufactured by Kabushiki Kaisha Tama Kagaku) for the dip development. After the dip development, a dry etching is carried out by using the etching mask formed by the dip development so as to pattern the light shielding film 102. Then, the etching mask is removed, followed by performing a washing treatment and a drying treatment, thereby finishing preparation of a reticle.

The reticle thus prepared was found to have a dimensional error on the plane of about 10 nm (3σ), supporting that it was possible to prepare a reticle (chromium mask) of a high accuracy.

As described above, in this embodiment, the light irradiation is applied a plurality of times to the portions of a low light intensity in the overlapping regions between adjacent light irradiated regions 301, 302, etc. so as to make uniform the energy imparted to the entire region of the photoresist film 103 (the entire heating region). Therefore, the temperature distribution can be made uniform over the entire photoresist film 103, making it possible to pattern the photoresist film 103 with a high accuracy. It should also be noted that, since the light shielding film 102 is patterned by utilizing the etching mask made of the photoresist film 103, it is possible to prepare a reticle having a high precision pattern of the light shielding film 102.

It should also be noted that, if the light irradiation is applied simultaneously to the light irradiated regions 301, 302, etc., the heat is migrated among the light irradiated regions 301, 302, etc., making it necessary to perform the control in view of the heat migration. In this embodiment, however, the light irradiating periods do not overlap with each other so as to decrease the migration of the heat among the light irradiated regions. It follows that the temperature distribution in each light irradiated region can be controlled easily, making it possible to render uniform easily the temperature distribution over the entire region of the photoresist, film 103. For example, where the second light irradiation is carried out before the temperature of the light irradiated region 301 having the first light irradiation applied thereto is lowered sufficiently, an excessive heat treatment is applied to the light irradiated region 302 because of the influence of the heat from the light irradiated region 301.

Also, in this embodiment, the wavelength region of the irradiating light is selected appropriately, making it possible to heat selectively the light shielding film 102 and the photoresist film 103 without heating the transparent quartz glass substrate 101. It follows that the temperature distribution of the photoresist film 103 can be made uniform.

Figure 8:
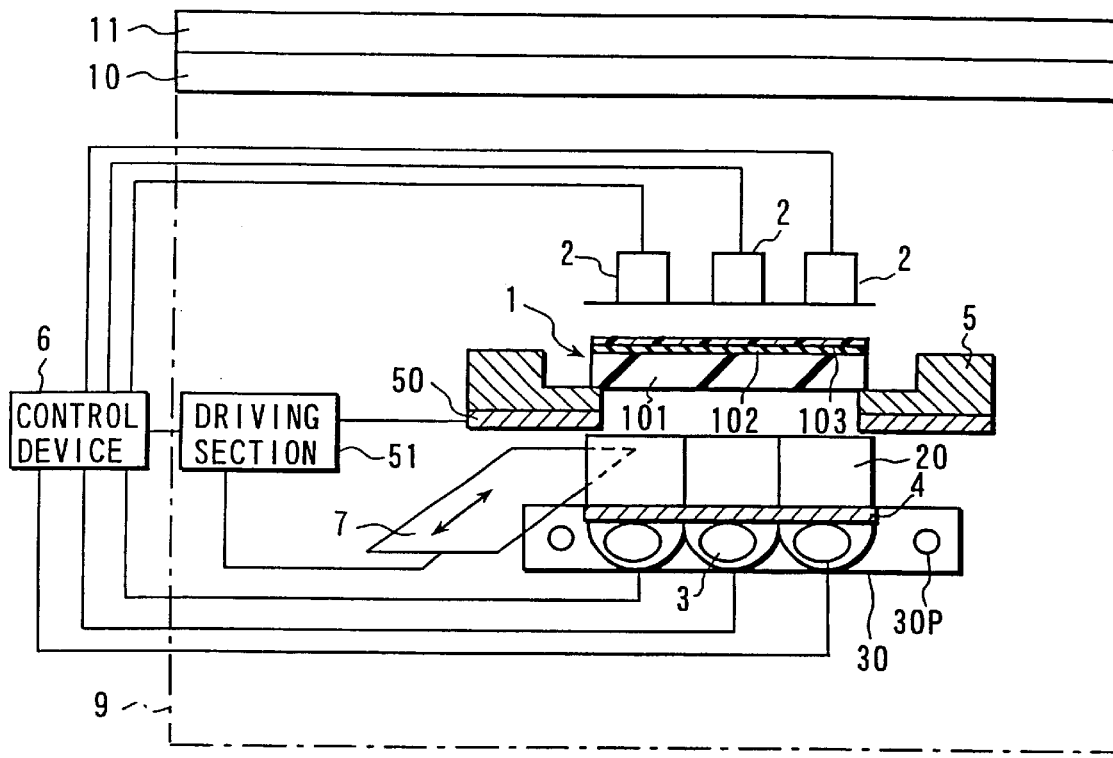
FIG. 8 schematically shows the construction of a heat treating apparatus provided with a plurality of infrared ray sensors according to the first embodiment of the present invention.

Incidentally, the single infrared ray sensor 2 is moved in the embodiment described above. However, it is possible to arrange 9 infrared ray sensors 2 to conform with the 9 light sources 3, i.e., 3×3, as shown in FIG. 8.

Also, in the embodiment described above, the light sources 3 are turned on one by one. However, it is possible to have a plurality of light sources 3 turned on simultaneously when it comes to the regions where the light irradiated regions do not overlap with each other.

Further, in the embodiment described above, used was a substrate (mask blank) 1 having the light shielding film 102 formed on the transparent quartz glass substrate 1. However, it is also possible to use a substrate (half tone mask) having a translucent film formed on the transparent quartz glass substrate 101. It is possible to use as the translucent film a laminate structure consisting of a $MoSi_2$ film and a Cr film laminated on the $MoSi_2$ film.

(Modification)

Figure 9:
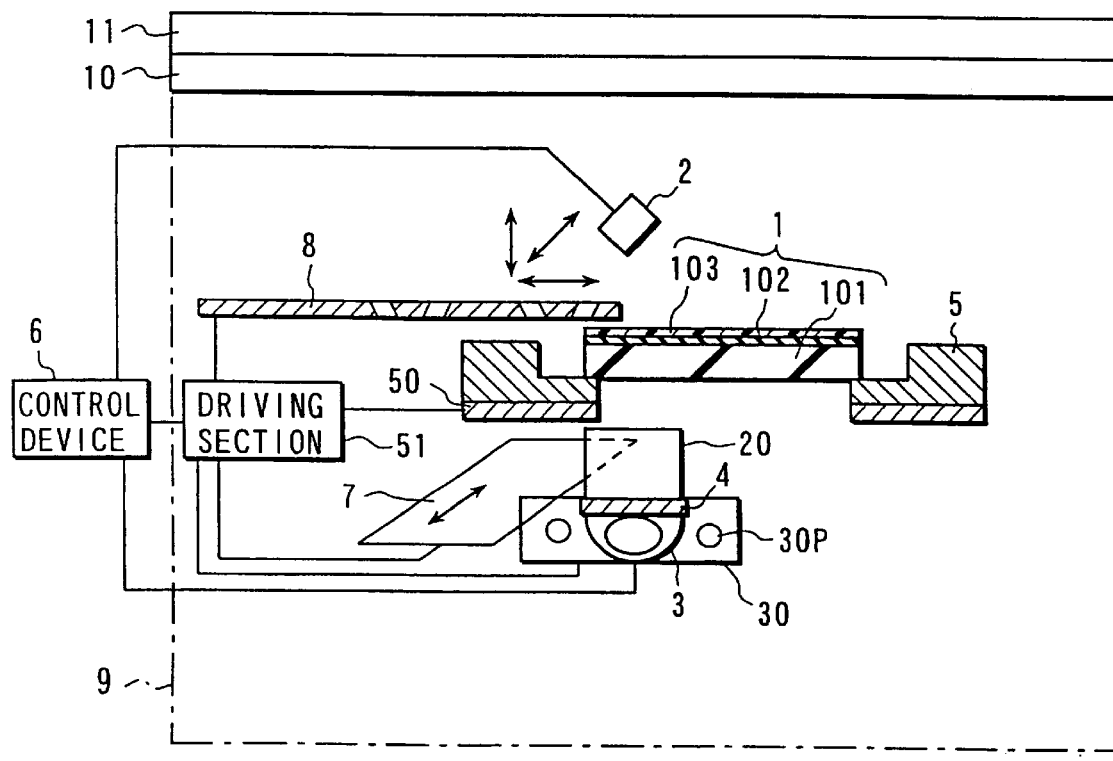
FIG. 9 schematically shows the construction of a heat treating apparatus according to a modification of the first embodiment of the present invention.

FIG. 9 schematically shows the construction of a heat treating apparatus according to a modification of the first embodiment of the present invention. The constituents of the heat treating apparatus corresponding to the constituents of the apparatus shown in FIG. 1 are denoted by the same reference numerals so as to omit the detailed description thereof.

Nine light sources 3 (halogen lamps) are arranged in the heat treating apparatus shown in FIG. 1. In the modification shown in FIG. 9 however, used is only one light source 3 (halogen lamp). Also, a light source support section 30 can be moved by the driving section 51 in this modification. Further, the filter 4 and the light guide 20 can be moved in the X- and Y-directions.

For operating the heat treating apparatus shown in FIG. 9, the substrate 1 similar to that used in the apparatus shown in FIG. 1 is disposed on the substrate support section 5, followed by applying a heat treatment to the substrate 1 by turning on the light source 3 as follows.

In the first step, a heat treatment is applied to the first light irradiated region 301 by the light source 3, as shown in FIG. 3. The control method of the heat treatment is equal to that described previously in conjunction with the first embodiment.

To be more specific, after the heat treatment of the light irradiated region 301 is finished by turning off the light source 3, the light source support section 30 is moved so as to set the position of the second light irradiation at a position deviated by 60 mm in the X-direction. The width of the overlapping region between the first light irradiated region 301 and the second light irradiated region 302 is about 5 mm. The second light irradiation is started after the substrate 1 is cooled to, for example, room temperature. What should be noted is that the first light irradiation and the second light irradiation are carried out not to overlap with each other in the irradiating time.

Then, the third light irradiation to the ninth light irradiation are carried out successively in the same fashion so as to finish the heat treatment applied to the entire region of the photoresist 103. Then, a developing treatment is applied to the photoresist film 103 as in the embodiment shown in FIG. 1, followed by patterning the light shielding film 102 so as to obtain a reticle.

In the modification described above, the light irradiation is carried out a plurality of times by moving the light source 3 (light source support section 30). Alternatively, it is possible to carry out the light irradiation a plurality of times by moving the substrate 1 (stage 50).

[Second Embodiment]

Figure 10:
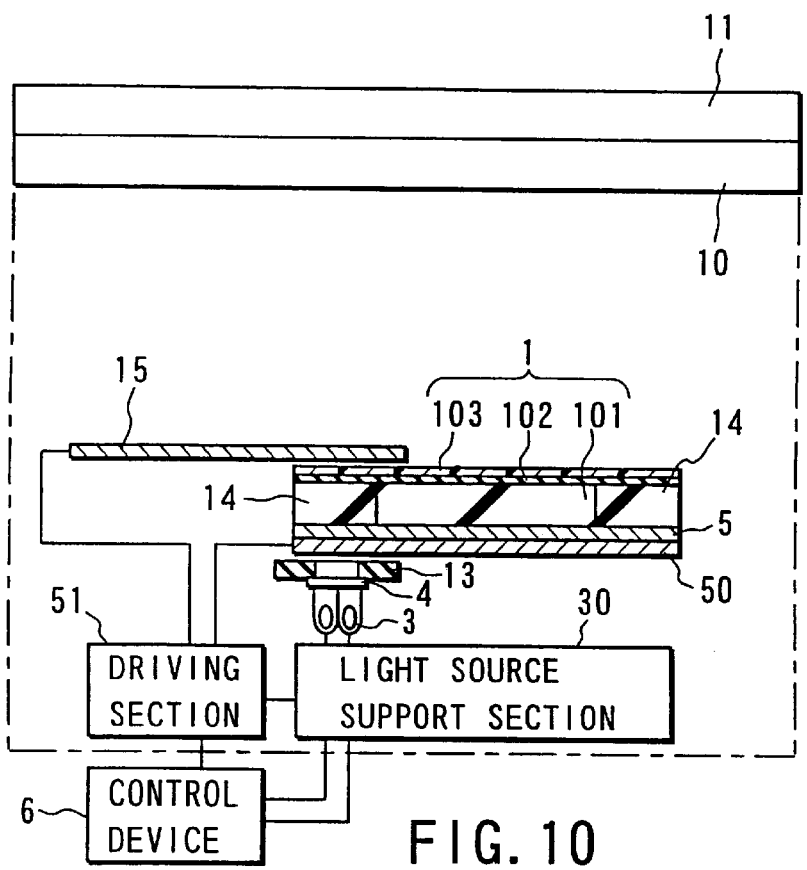
FIG. 10 schematically shows the construction of a heat treating apparatus according to a second embodiment of the present invention.

FIG. 10 schematically shows the construction of a heat treating apparatus according to a second embodiment of the present invention. As in the first embodiment, a photo mask blank equipped with a photoresist is used as the substrate 1 in the second embodiment, too.

The light source 3 is arranged below the substrate 1 supported by the substrate support section 5, and a heat treatment is applied to the substrate 1 by the light source 3 from the back surface side of the substrate 1. A halogen lamp having, for example, the maximum output of 300 W and the wavelength at the maximum output of 900 nm is used as the light source 3.

Figure 11A:
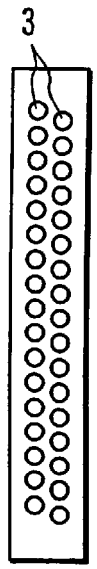
FIG. 11A shows the layout of the light sources in a heat treating apparatus according to the second embodiment of the present invention.
Figure 12:
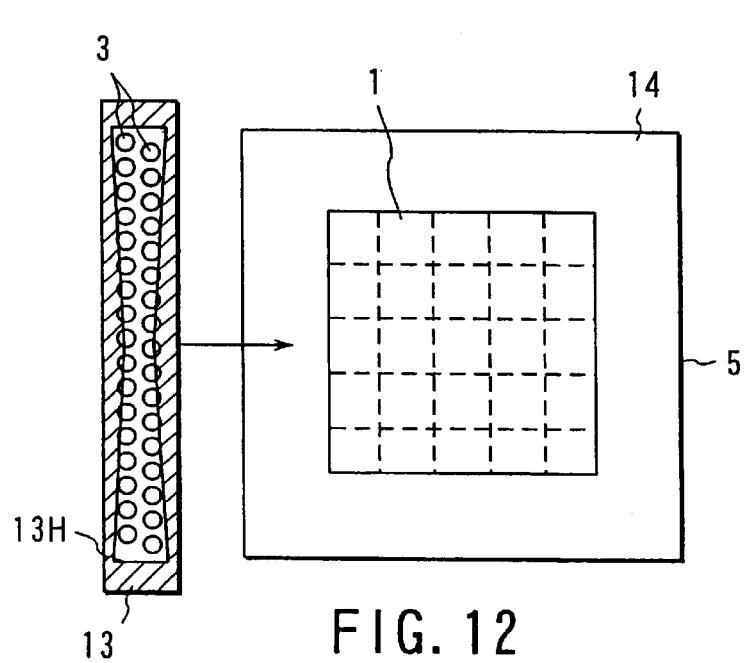
FIG. 12 is a plan view showing a gist portion of the heat treating apparatus according to the second embodiment of the present invention.
Figure 11B:
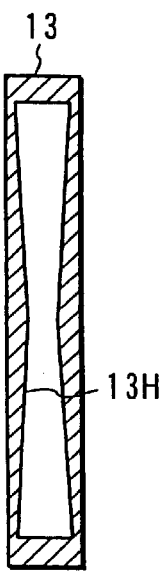
FIG. 11B is a plan view showing the slit in the heat treating apparatus according to the second embodiment of the present invention.

FIG. 11A shows the layout of the light source 3, and FIG. 11B is a plan view of a slit 13. FIG. 12 is a plan view showing the positional relationship among the substrate 1, the substrate support section 5, the light source 3 and the slit 13. The light source 3 consists of halogen lamps supported on a light source support section 30. As shown in the drawings, a total of 34 halogen lamps are equidistantly arranged (i.e., 2 halogen lamps in the X-direction and 17 halogen lamps in the Y-direction) on the light source support section 30. Each light source 3, i.e., a single halogen lamp, is capable of irradiating a region having a diameter of 15 mm. Therefore, the entire light source 3 consisting of 34 halogen lamps is capable irradiating a region of 30 mm×255 mm.

As shown in FIG. 10, the slit 13 is arranged between the substrate 1 and the light source 3 and is movable together with the light source 3. In order to limit the light irradiating region of the entire light source 3, the slit 13 is provided with an opening 13H which is 30 mm in the X-direction and 255 mm in the Y-direction. The width of the opening is narrowed in the central portion of the opening 13H so as to lower the irradiating light intensity (or to decrease the energy amount). In other words, the irradiating intensity of the light passing through the opening 13H is made uniform by narrowing the width of the opening 13H in the central portion where the irradiating intensity is high. In other words, the irradiating light is shaped to permit the light intensity distribution to be made uniform within the light irradiated region.

It should also be noted that the irradiating light intensity is made nonuniform by the nonuniformity in the resistance value of the halogen lamps constituting the light source 3. In order to overcome this difficulty, the irradiating light intensity for each halogen lamp (light source 3) is measured in advance, and a suitable voltage is supplied from the control device 6 to each of the halogen lamps (light source 3) based on the result of the measurement so as to make uniform the irradiating light intensity.

The filter 4 consisting of two band-pass filters superposed one upon the other is interposed between the light source 3 and the slit 13, as in the first embodiment of the present invention.

The substrate support section 5 is mounted on the stage 50 movable in the X-direction, Y-direction and Z-direction. The stage 50 can be moved in a predetermined direction by the driving section 51, which is controlled by the control device 6. The stage 50 and the driving section 51 constitute a light irradiating position moving mechanism for changing the light irradiating position relative to the heating region of the substrate 1. Also, the light source support section 30 is connected to the driving section 51, making it possible for the light source support section 30 and the driving section 51 to collectively constitute the light irradiating position moving mechanism. It basically suffices for the heat treating apparatus to comprise one of these two mechanisms, particularly, the latter light irradiating position moving mechanism.

The substrate support section 5 is provided with a frame 14 surrounding the periphery of the substrate 1. The frame 14 is of a laminate structure consisting of a transparent quartz glass plate and a light shielding film material formed on the glass plate, like the substrate 1. Naturally, the substrate 1 and the frame 14 are equal to each other in the heat conductivity, making it possible to render the heat diffusion from the substrate 1 uniform. Also, the surface of the substrate 1 coincides in height with the surface of the frame 14 under the state that the substrate 1 is mounted on the substrate support section 14.

A reflecting plate 15 is arranged above the substrate 1. The reflecting plate 15 serves to reflect the light transmitting through the substrate 1 so as to improve the heating efficiency of the substrate 1. The reflecting plate 15 can be moved in the X-direction, Y-direction and Z-direction by the driving section 51. It is possible for the reflecting plate 15 to be provided with a heater for controlling the temperature equal to the heat treating temperature of the substrate 1. The particular reflecting plate 15 can be obtained by polishing the surface of an aluminum plate excellent in heat conductivity and by arranging a heater pattern on the back surface of the aluminum plate.

It is possible to use a black body plate capable of holding the energy imparted by the light irradiation in place of the reflecting plate 15. As a base plate of the reflecting plate 15 and the black body plate, it is possible to use a metal plate such as a stainless steel plate in addition to the aluminum plate. The reflecting plate can be prepared by polishing the surface of a metal plate, and the black body plate can be prepared by spraying uniformly a black paint on the surface of a metal plate. Further, it is possible to use a light scattering plate in place of the reflecting plate 15.

The apparatus outer frame 9, the dust filter 10, the chemical filter 11 and the exhaust duct (not shown) included in the heat treating apparatus according to the second embodiment of the present invention are equal to those included in the heat treating apparatus of the first embodiment described previously.

The heat treating method using the heat treating apparatus shown in FIG. 10 will now be described.

In the first step, the substrate 1 equal to that shown in FIG. 1 is disposed on the substrate support section 5 and heated by the light source 3 as described below.

Specifically, a heat treatment is applied to a light irradiated region 401 by the light source 3 as shown in FIG. 13. After the heat treatment applied to the light irradiated region 401, the light source support section 30 is moved by 30 mm in the X-direction so as to set a second light irradiating position 402. In this step, the edge of the second light irradiated region 402 is aligned with the edge of the first light irradiated region 401. In other words, the second embodiment differs from the first embodiment in that the two adjacent light irradiated regions 401 and 402 do not overlap with each other. The second light irradiation is started after the temperature of the substrate 1 is lowered, for example, to room temperature. In other words, the first light irradiation and the second light irradiation do not overlap with each other in the light irradiation time.

Likewise, the third light irradiation et seq. are consecutively carried out such that the adjacent light irradiated regions do not overlap with each other so as to finish the heat treatment over the entire region of the photoresist film 103. Then, a developing treatment is applied to the photoresist film 103 as in the first embodiment shown in FIG. 1, followed by patterning the light shielding film 102 so as to finish. preparation of a reticle.

The reticle thus prepared was found to have a dimensional error of 8 nm (3σ) within the plane, supporting that it is possible to prepare a high precision reticle (chromium mask).

As described above, in the second embodiment, the heat treatment is applied to the photoresist film 103 by using the slit 13 so as to make the light intensity distribution uniform within the light irradiated region. As a result, the light intensity distribution is made uniform over the entire region of the photoresist film 103. It follows that the second embodiment makes it possible to prepare a reticle having a high precision pattern of the light shielding film 102, like the first embodiment described previously.

Also, the heat treating apparatus of the second embodiment comprises a reflecting plate, a black body plate or a light scattering plate. In this case, the light emitted from the light source 3 is reflected by the reflecting plate toward the substrate 1. Alternatively, the light energy emitted from the light source 3 is held by the black body plate, or the light from the light source 3 is scattered by the light scattering plate toward the substrate 1. It follows that the heating efficiency by the light irradiation is improved.

Also, the reflecting plate 15 is provided with a heater, making it possible to improve further the heating efficiency by the light irradiation. To be more specific, it was possible to improve the heating efficiency by about 2%, and it was also possible to improve the uniformity of the temperature of the photoresist film 103 formed on the substrate 1. Particularly, the concentric size distribution derived from the temperature distribution within the reticle plane was markedly improved so as to obtain a reticle of a high accuracy.

Further, the substrate 1 is surrounded by the frame 14 having a structure similar to that of the substrate 1, making it possible to prevent the temperature in the peripheral region of the substrate 1 from being lowered. Thus, the uniformity of the heating temperature of the substrate 1 can be improved.

In the second embodiment described above, the light source 3 is moved with the substrate 1, i.e., the stage 50, fixed. However, it is also possible to move the stage 50 with the light source 3 fixed.

Also, in the second embodiment described above, the light source for a certain light irradiated region is turned on, followed by turning off the light source so as to move the light source to the next light irradiating region. However, it is also possible to scan the light source continuously with the light source kept turned on continuously.

(Modification 1)

FIG. 14 shows the layout of the light source 3 according to a first modification of the second embodiment of the present invention. As shown in the drawing, the light sources 3 (halogen lamps) are positioned to form two columns arranged side by side in the X-direction in the upper and lower regions of the array of the light sources 3, with the light sources 3 being positioned to form a single column in the central region of the array of the light sources 3. In this modification, a slit is not required, and the irradiating light intensity in the light irradiated regions is made uniform by the arrangement of the light sources 3. Since the slit 13 is not required, the construction of the heat treating apparatus can be simplified.

(Modification 2)

FIG. 15 shows the layout of the light source 3 according to a second modification of the second embodiment of the present invention. As shown in the drawing, the light sources 3 include light sources 3L arranged in the upper and lower regions of the array of the light sources 3 and light sources 3S arranged in the central region of the array of the light sources 3. In this modification, the light irradiating intensity for the light source 3L is higher than that for the light source 3S. It follows that the light irradiating intensity of the light irradiated region can be made uniform by the arrangement of the light sources 3L and 3S. Needless to say, a slit is not required in this modification. Since the slit 13 is not required, the construction of the heat treating apparatus can be simplified.

(Modification 3)

In each of the modifications described above, the entire light source is vertically oblong, and the light irradiated regions are moved in the X-direction. In the third modification, however, the light irradiated regions are moved in the X-direction and the Y-direction. The basic construction of the apparatus is equal to that shown in FIG. 9, and a single light source 3 is moved in the X-direction and the Y-direction. In the third modification, however, the irradiating light is shaped by, for example, a slit to permit the light intensity distribution uniform within the light irradiated region, as in the embodiment described previously.

In this modification, the substrate 1 equal to that shown in FIG. 1 is disposed on the substrate support section 5, followed by performing the heat treatment by the light source 3 as follows.

In the first step, a heat treatment is applied to a light irradiated region 411 by the light source 3, as shown in FIG. 16.

After the heat treatment applied to the light irradiated region 411, the light source support section 30 is moved in the X-direction so as to set a second light irradiating position. In this step, the edge of the second light irradiated region 412 is aligned with the edge of the first light irradiated region 411. In other words, the adjacent light irradiated regions 411 and 412 do not overlap with each other. The second light irradiation is started after the substrate 1 is cooled to, for example, room temperature. In other words, the first light irradiation and the second light irradiation do not overlap with each other in the light irradiating time.

Likewise, the third light irradiation et seq. are consecutively carried out to cover the light irradiated regions 413, 414, 415, etc. such that the adjacent light irradiated regions do not overlap with each other so as to finish the heat treatment over the entire region of the photoresist film 103. Then, a developing treatment is applied to the photoresist film 103 as in the first embodiment shown in FIG. 1, followed by patterning the light shielding film 102 so as to finish preparation of a reticle.

Figures 17A, 17B:
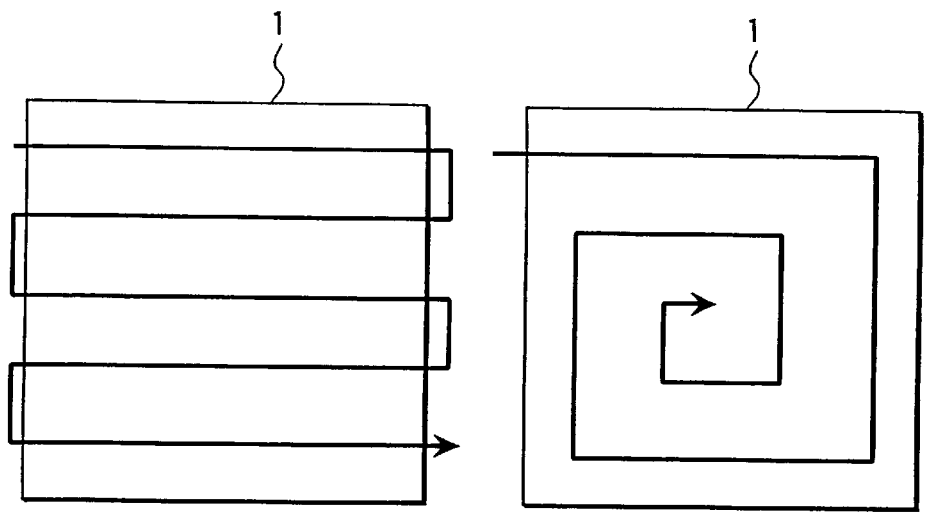
FIGS. 17A and 17B are for explaining the heat treating method according to a third modification of the second embodiment of the present invention.

The moving method of the light source is not limited to the example described above. For example, it is possible to move the light source in the order shown in FIG. 17A or 17B.

(Modification 4)

Figure 18:
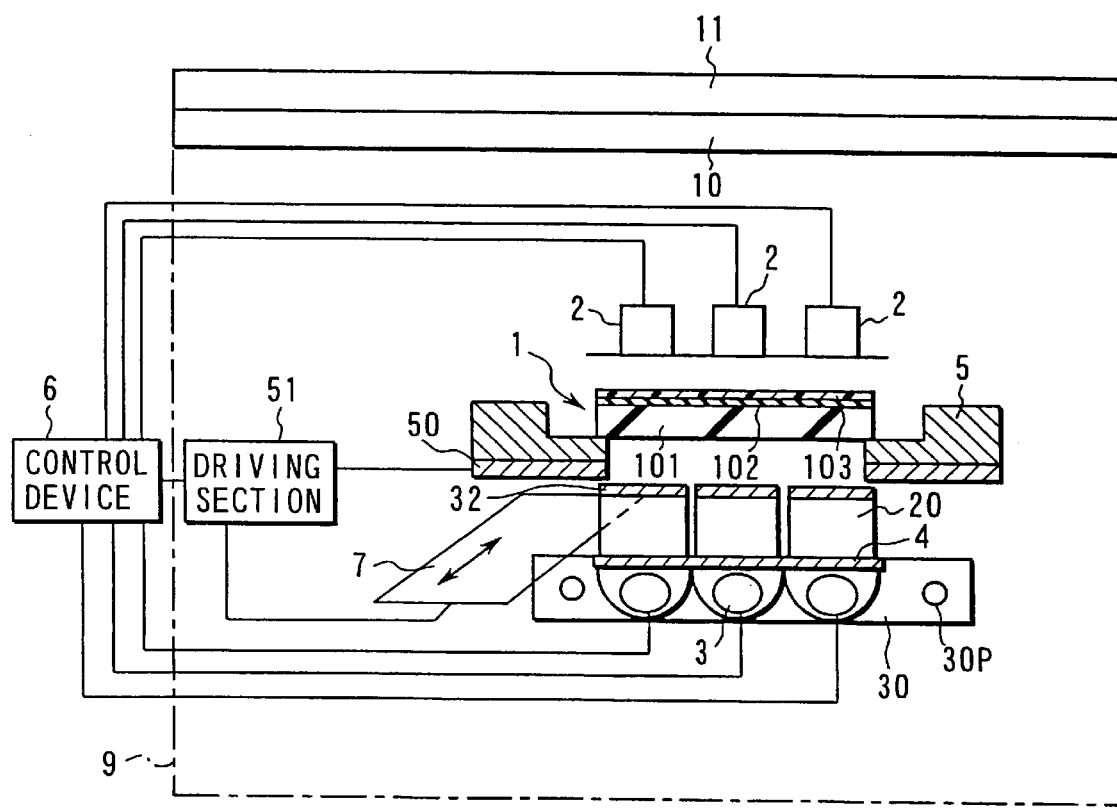
FIG. 18 schematically shows the construction of a heat treating apparatus according to a fourth modification of the second embodiment of the present invention.

FIG. 18 schematically shows the construction of a heat treatment according to a fourth modification of the second embodiment of the present invention. The irradiating light is shaped in this modification, too, to permit the light intensity distribution to be uniform within the light irradiated region.

In each of the modifications described above, the light irradiation is carried out by moving the substrate or the light source. In the fourth modification, however, the light irradiation is carried out with the positions of the substrate and the light source held stationary. Therefore, required are 9 infrared ray sensors 2 corresponding to the 9 light sources (3×3).

Also, a filter 32 for adjusting the intensity distribution of the light emitted from the light source 3 is arranged on the light guide 20. The irradiating light is adjusted by the filter 32 to permit the light intensity distribution to be made uniform within the light irradiated region. Also, a clearance is provided between the adjacent light guides 20. By this particular construction, the edge of a light irradiating region is exactly aligned with the edge of the adjacent light irradiating region. In other words, the adjacent light irradiating regions do not overlap with each other.

For performing the heat treatment according to the fourth modification of the second embodiment of the present invention, the substrate 1 equal to that shown in FIG. 1 is disposed on the substrate support section 5, and the heat treatment is performed by the light source 3 as follows.

In the first step, a heat treatment is applied to a light irradiated region 411 by the light source 3. After the heat treatment applied to the light irradiated region 411, a light irradiation is applied to a light irradiating region 412 by using a light source 3 differing from the light source 3 used for the first light irradiation, with the positions of the substrate 1 and the light source 3 held stationary. It should be noted that the edge of the second light irradiated region is aligned exactly with the edge of the first light irradiated region. In other words, the adjacent light irradiated regions do not overlap with each other. The second light irradiation is started after the substrate 1 is cooled to, for example, room temperature. In other words, the first light irradiation and the second light irradiation do not overlap with each other in the light irradiating time.

Likewise, the third light irradiation to the ninth light irradiation are carried out by each of the light sources 3, with the positions of the substrate 1 and the light source 3 held stationary, such that the adjacent light irradiated regions do not overlap with each other so as to finish the heat treatment over the entire region of the photoresist film 103. Then, a developing treatment is applied to the photoresist film 103 as in the first embodiment shown in FIG. 1, followed by patterning the light shielding film 102 so as to finish preparation of a reticle.

In the fourth modification described above, the light sources 3 are turned on one by one. However, it is possible to turn on a plurality of light sources simultaneously. Further, all the light sources 3 can be turned on simultaneously. In other words, it is possible for the adjacent light irradiated regions to overlap with each other in the light irradiating time.

[Third Embodiment]

Figure 19:
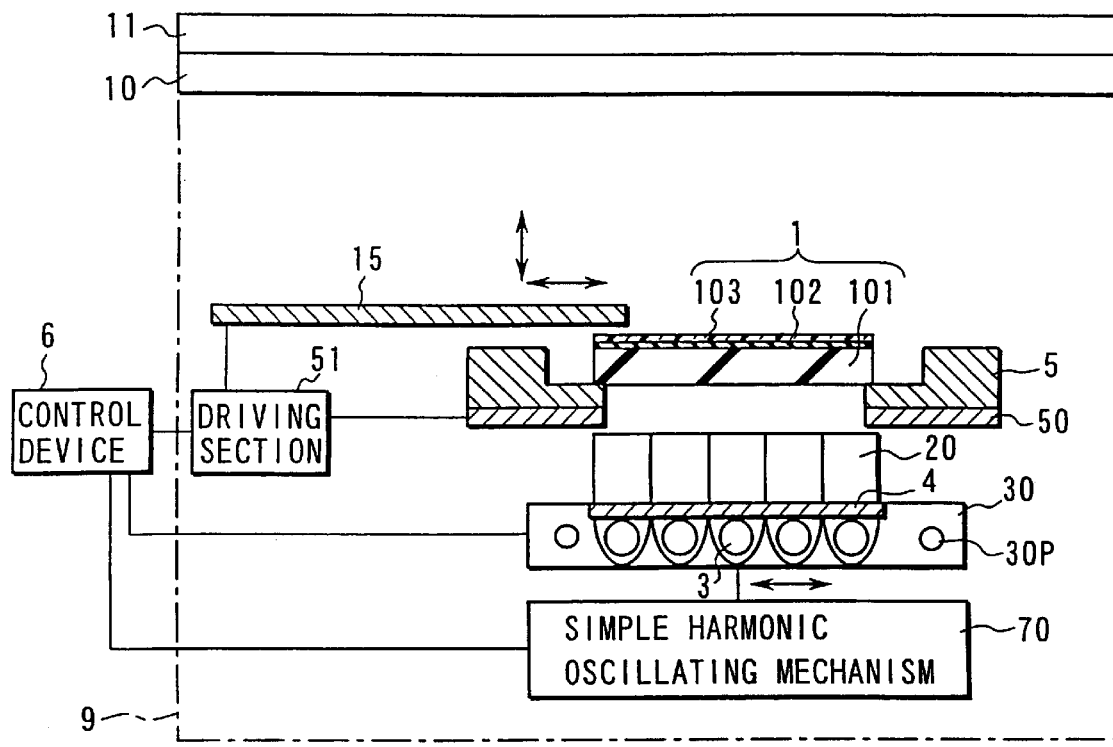
FIG. 19 schematically shows the construction of a heat treating apparatus according to a third embodiment of the present invention.

FIG. 19 schematically shows the construction of a heat treating apparatus according to a third embodiment of the present invention.

As in the first embodiment, a photo mask blank equipped with a photoresist is used as the substrate 1.

As in the first embodiment, a halogen lamp is used as the light source 3. A total of 25 halogen lamps are equidistantly arranged such that 5 halogen lamps are arranged in each of the X- and Y-directions. The light sources 3 slightly differ from each other in the irradiating light intensity, which is caused by the nonuniformity in the resistance values of the light sources 3. However, the difference in the irradiating light intensity can be detected in advance by measuring the light irradiating intensities of the individual light sources 3. It follows that a suitable voltage is applied from the control device 6 to each of the light sources 3 to achieve a uniform light irradiating intensity.

The light guide 20 is arranged between the light source 3 and the substrate 1, and the filter 4 is arranged between the light source 3 and the light guide 20. These basic constructions are equal to those of the first embodiment shown in FIG. 1.

The substrate support section 5 is arranged on the stage 50 movable in the X-direction, Y-direction and Z-direction. The stage 50 can be moved in a predetermined direction by the driving section 51. The driving section 51 is controlled by the control device 6. It should be noted that the stage 50 and the driving section 51 collectively form a light irradiating position moving mechanism for changing the light irradiating position relative to the heating region of the substrate 1.

The light source support section 30 is connected to a light irradiating position simple harmonic oscillating mechanism 70. The simple harmonic oscillating mechanism 70 permits the light source support section 30 (light irradiating position) to be repeatedly reciprocated in a predetermined direction in the X-direction or Y-direction relative to the heating region of the substrate 1. The simple harmonic oscillation is controlled by the control device 6. Incidentally, it is possible for the substrate support section 5 to be subjected to the simple harmonic oscillation in place of the light source support section 30.

The reflecting plate 15 is arranged above the substrate 1. The reflecting plate 15 is equal to the reflecting plate used in the second embodiment of the present invention. It is possible for the reflecting plate 15 to be equipped with a heater as in the second embodiment. Also, a black body plate or a light scattering plate can be used in place of the reflecting plate 15.

The third embodiment is equal to the first embodiment in respect of the apparatus outer frame 9, the dust filter 10, the chemical filter 11 and the exhaust duct (not shown).

The heat treating method using the heat treating apparatus shown in FIG. 19 will now be described.

In the first step, the substrate 1 equal to that shown in FIG. 1 is disposed on the substrate support section 5. The substrate 1 is set such that the center of the substrate 1 is aligned with the center of the light irradiating region of the light source 3 as viewed from above.

Then, the heating of the photoresist film 103 is started. The simple harmonic oscillation is started as soon as voltage is applied to the light source 3. The amplitude of the oscillation is 24.7 mm ($2^{1/2}/2$ times as large as the diameter of the light irradiated region), the cycle is 10 seconds, and the oscillation is performed in a direction of 45° (i.e., the direction equal to the moving direction of the light irradiated position shown in FIG. 7). Further, the irradiating time of the light source 3 is 200 seconds.

After completion of the heat treatment applied to the entire surface of the photoresist film 103, the photoresist film 103 is subjected to a developing treatment as in the first embodiment, followed by patterning the light shielding film 102 so as to finish preparation of a reticle.

The reticle thus prepared was found to have a size error of 8 nm (3σ) within the plane, supporting that it was possible to obtain a high precision reticle (chromium mask).

In the third embodiment described above, the heat treatment was applied to the photoresist film 103 (heating region) while subjecting the light irradiated region to the simple harmonic oscillation, making it possible to apply the light irradiation a plurality of times to that portion of the light irradiated region in which the light intensity is low so as to supplement the light intensity. It follows that the light intensity distribution can be made uniform over the entire heating region. Particularly, since there is no boundary between the adjacent light irradiated regions, it is possible to eliminate the nonuniformity in the total energy accompanying the light irradiation. It follows that it is possible to markedly improve the concentric size distribution derived from the temperature distribution within a plane of the reticle.

Incidentally, in the third embodiment, it is possible to employ in combination both the simple harmonic oscillating movement and the rotary movement. It is also possible to subject the substrate 1 to the simple harmonic oscillating movement.

[Fourth Embodiment]

The fourth embodiment is directed to the heat treatment in forming an antireflection film on a semiconductor substrate (silicon wafer). Various methods described previously in conjunction with the various embodiments can be employed for the basic heat treatment. Specific examples will now be described.

Figure 20A:
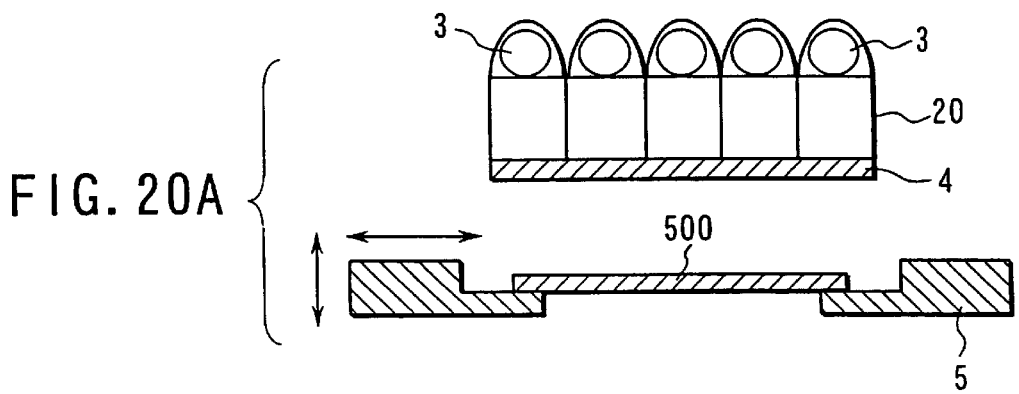
FIG. 20A shows the gist portion of a heat treating apparatus according to a fourth embodiment of the present invention.

FIG. 20A shows the gist portion of the heat treating apparatus according to the fourth embodiment of the present invention.

As shown in the drawing, a target substrate 500 prepared by coating a silicon substrate with an antireflection film having a thickness of 50 nm is disposed on the substrate support section 5. The light source 3 including 21 halogen lamps and the light guide 20 sized 50 mm square are arranged above the target substrate 500.

Figure 20B:
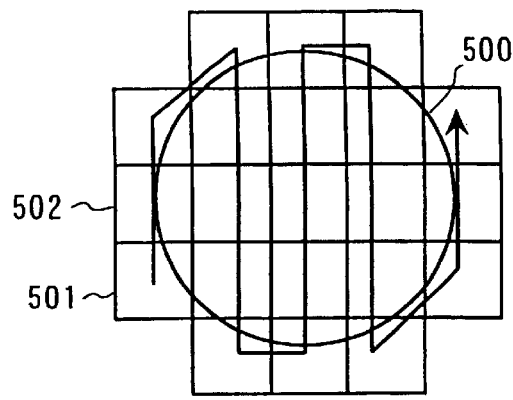
FIG. 20B is for explaining the heat treating method according to the fourth embodiment of the present invention.

After the target substrate 500 is disposed on the target support section 5, a heat treatment is applied to the light irradiated region 501 shown in FIG. 20B by the light source 3. To be more specific, after the light source 3 is turned on, the heating is applied at a temperature elevation rate of 40° C./sec. After the temperature is maintained at 200° C. for 20 seconds, the light source 3 is turned off.

After the heat treatment applied to the light irradiated region 501, the light irradiation is applied to a light irradiated region 502 by a light source 3 differing from the light source 3 used in the first light irradiation. The second light irradiation is started after the substrate 500 is cooled to, for example, room temperature. In other words, the first light irradiation and the second light irradiation do not overlap with each other in the light irradiation time.

Likewise, the third light irradiation to the twenty-first light irradiation are applied in the order denoted by an arrow in FIG. 20B by the light source 3 so as to finish the heat treatment over the entire region of the photoresist film 103.

The embodiment described above is directed to the heat treatment for forming an antireflection film on a silicon substrate. However, the present invention can be similarly applied to the heat treatment of various films formed on a silicon substrate. For example, the present invention can be employed for the heat treatment applied to an SOG film formed on a silicon substrate and for the heat treatment applied to a resist film on the antireflection film formed on a silicon substrate.

The first to fourth embodiments of the present invention described above can be employed for various heat treatments. For example, these embodiments can be employed for the thermal diffusion treatment of the impurity ions implanted into a semiconductor substrate and for the thermal diffusion treatment of the impurity ions implanted into a polycrystalline silicon (polysilicon) film. Further, the first to fourth embodiments of the present invention can be employed for improvement of an oxide film formed on a semiconductor substrate.

Further, the present invention can be employed for the heat treatment applied to a substrate of a liquid crystal display device, e.g., a transparent quartz glass substrate, particularly to a photoresist film formed on the substrate, and for the manufacturing process of a color filter included in a liquid crystal display device.

As described above, in the first to fourth embodiments of the present invention, the light intensity distribution for the light irradiation can be made uniform, and the temperature distribution in the heating region of or on a target substrate can also be made uniform. Further, a fine patterning process can be achieved with a high accuracy by making the temperature distribution uniform in the heating region.

[Fifth Embodiment]

Figure 21:
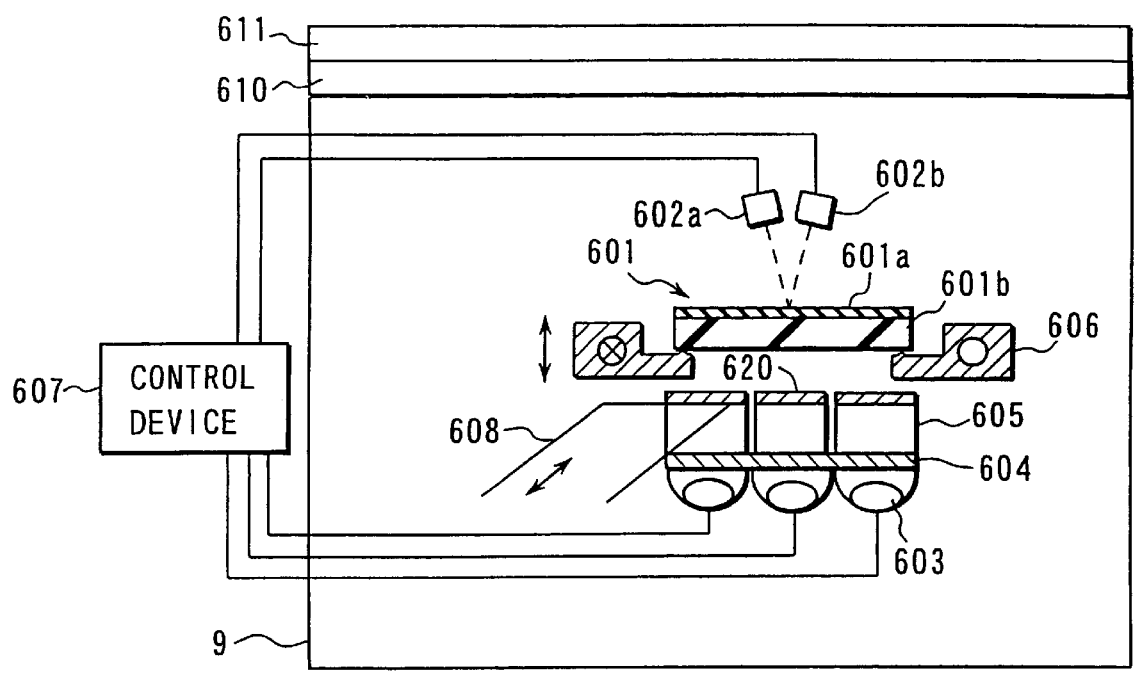
FIG. 21 schematically shows the construction of a heat treating apparatus according to a fifth embodiment of the present invention.

A fifth embodiment of the present invention will now be described with reference to FIG. 21, which is directed to a trial manufacture of a chromium mask used in the manufacturing process of a semiconductor device.

In this embodiment, a chromium mask blank equipped with a resist, which has a size of 6 inches and a thickness of 0.25 inch, is used as a target substrate 601. To be more specific, a target thin film 601a consisting of a chromium film and a resist film is formed on a quartz substrate 601b so as to provide the target substrate 601.

Radiation thermometers 602a and 602b are arranged above the target substrate 601. The radiation thermometer 601a mainly serves to detect the temperature information relating to the target thin film 601a, and the radiation thermometer 601b mainly serves to detect the temperature information relating to the quartz substrate 601b. The number of each of these radiation thermometers 602a and 602b corresponds to the number of lamps. In other words, since 9 lamps are used, used are 9 radiation thermometers 602a and 9 radiation thermometers 602b. By arranging these radiation thermometers 602a and 602b above the target substrate 601, the construction of the heat treating apparatus can be simplified.

Figure 22:
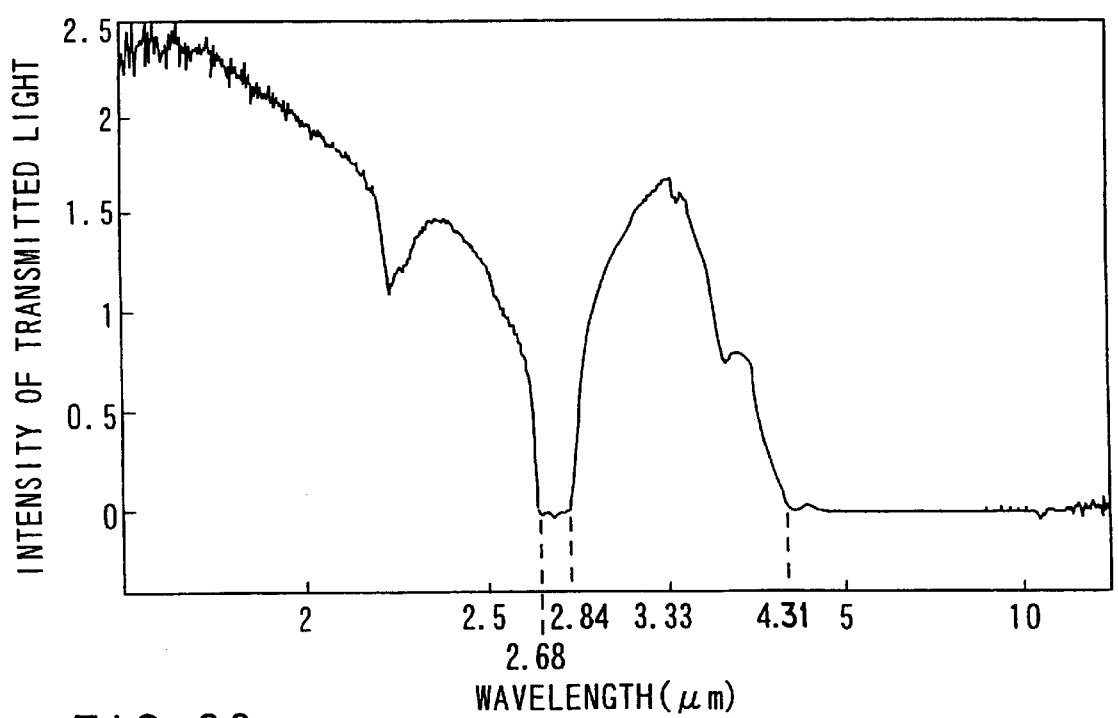
FIG. 22 is a graph showing the relationship between the intensity of the light transmitted through a chromium mask blank equipped with a resist and the wavelength of the light according to the fifth embodiment of the present invention.

FIG. 22 is a graph showing the relationship between the intensity of the light transmitting through the target substrate 601 and the wavelength of the transmitting light. As shown in the graph, the intensity of the transmitting light is substantially zero in the wavelength range between 2.68 and 2.84 μm and in the wavelength region not shorter than 4.31 μm by the effect of the target thin film 601a. In the wavelength range between 2.84 μm and 4.31 μm, the light is transmitted to some extent through the target thin film 601a and the quartz substrate 601b. Such being the situation, the radiation thermometer 602a is set to detect the light having a wavelength of 8 to 14 μm, and the radiation thermometer 602b is set to detect the light having a wavelength of 2.8 to 4.3 μm. Incidentally, since the light having a wavelength of 2.68 μm or less is transmitted to some extent through the target thin film 601a and the quartz substrate 601b, it is possible to set the radiation thermometer 602b to detect the light having a wavelength of, for example, 2 to 2.7 μm.

Nine halogen lamps 603, which are positioned below the target substrate 601, are equidistantly arranged to form a lattice consisting of 3 rows and 3 columns (3×3=9). Each halogen lamp 603 has a maximum output of 150 W and the wavelength at the maximum output is 1100 nm.

A filter 604 is arranged on the halogen lamp 603, and a light guide 605 is arranged on the filter 604. The filter 604 is of a band-pass filter structure consisting of two filters capable of cutting the light components having wavelengths of about 1.4 μm and not shorter than 2.2 μm, which are the light components absorbed by the quartz substrate 601b. It follows that the light components emitted from the halogen lamp 603 and passing through the filter 604 and light guide 605 to reach the target substrate 601 serve to selectively heat the target thin film 601a while scarcely heating the quartz substrate 601b.

A filter 620 for adjusting the intensity distribution of the light emitted from the halogen lamp 603 is arranged on the light guide 605. The irradiating light is adjusted by the filter 620 to permit the light intensity distribution to be made uniform within the light irradiated region. Also, a clearance is provided between adjacent light guide 603. By the particular construction, the edge of a certain region irradiated with the light emitted from the halogen lamp is exactly aligned with the edge of the adjacent region irradiated with the light emitted from the halogen lamp 603.

The target substrate 601 is supported by a mask support section 606. The mask support section 606 consists of a main body made of a stainless steel and mask support portions made of Teflon and serving to support the target substrate at four edge portions. A temperature control water flows inside the mask support section 606 so as to achieve a temperature control.

The radiation thermometers 602a and 602b and the halogen lamp 603 are controlled by a control section 607. To be more specific, the temperature information obtained by the radiation thermometers 602a and 602b, i.e., the temperature information for 9 sets of the radiation thermometers, is supplied to the control section 607, and the voltage or power supplied to the halogen lamp 603 is controlled on the basis of the temperature information supplied to the control section 607. It should be noted that the 9 halogen lamps controlled independently.

In the control section 607, the following calculation is carried out on the basis of the temperature information obtained by the radiation thermometers 602a and 602b.

Specifically, $T_s$ represents the treating temperature of the heated section 601a (the target temperature is 100° C. in this embodiment), $T_1(t)$ represents the temperature of the heated section 601a at time t, i.e., the time starting from the initiating step of the heat treatment, which is obtained on the basis of the temperature information detected by the temperature detecting section 602a, and $T_2(t)$ represents the temperature of the quartz substrate 601b at time t, which is obtained on the basis of the temperature information detected by the temperature detecting section 602b.

Under the condition of the time $t \leq t_a$ ($t_a = C \times t_1 (0 < C \leq 1)$), the time $t_1$ when $T_1$ is equal to $T_s$, i.e., $T_1 = T_s$, is estimated on the basis of the temperature $T_1$ of the heated section 601a and the temperature elevation rate $\delta T_1/\delta t$ of the heated section 601a. C, which can be set at an optional value, is set at 0.985, i.e., C=0.985. It is possible to estimate the time $t_1$ further in view of $\delta^2 T_1/\delta t^2$.

Under the condition of the time $t \leq t_a$, the output R(t) to the halogen lamp 603 is determined by using the formula:

$$R(t) = F(T_s - T_1, \delta T_1/\delta t)$$

Also, under the condition of the time $t > t_a$, the output R(t) to the halogen lamp 603 is determined by using the formula:

$$G(T_1 - T_2) \times H(\delta T_1/\delta t, \delta T_2/\delta t)$$

It is also possible to use variables of $\delta^2 T_1/\delta t^2$ and $\delta^2 T_2/\delta t^2$.

The target substrate 601 is transferred by a transfer arm 608. Also, in order to measure the temperature accurately, the measuring system is isolated from the disturbance by the apparatus outer frame 609 so as to prevent turbulence of the gas stream. Also, an exhaust duct (not shown) is arranged in order to discharge the gas or the like generated during the heat treatment to the outside. The vapor of an organic material or the like is prevented by the exhaust duct from being attached to the inner wall of the heat treating apparatus. Further, a dust filter 610 and a chemical filter 611 are arranged in order to control the dust and the atmosphere within the apparatus.

An example of the heat treatment performed by using the apparatus shown in FIG. 21 will now be described.

In the first step, the target substrate 601 is prepared. The target substrate 601 is prepared by coating a quartz substrate having a Cr film formed thereon with a positive chemically amplified resist film in a thickness of 500 nm, followed by applying an exposure to the coated resist film by using an electron beam writing apparatus (50 keV, 7 $\mu$C/cm$^2$). After the position of the target substrate 601 is determined by a position determining unit (not shown), the target substrate 601 is transferred by the transfer arm 608 so as to be disposed on the mask support section 606.

The temperature measurement by the radiation thermometers 602a and 602b are started as soon as the target substrate 601 is disposed on the mask support section 606. The temperature measurement is started by a trigger signal supplied from the control section 607.

The period for taking the temperature data is set at 10 msec, and the processing time is set at 40 sec. After the target substrate 601 is disposed on the mask support section 606, the heating by the halogen lamp 603 is started. Also, the temperature data obtained by the radiation thermometers 602a and 602b are supplied to the control section 607.

During the heat treatment, the temperature T(t) of the target thin film 601a at the time t is calculated by using the formula:

$$T(t) = T_1 + (\delta T_1/\delta t) \times \Delta t$$

Also, the time $t_1$ when T(t) is elevated to reach the treating temperature (target temperature) $T_s$ is calculated. In this example, $t_1 = 10.00$ seconds was calculated before arriving at the target temperature. Also, the time $t_a$ (=9.85 seconds) when the voltage application was changed was calculated on the basis of the numeral C (=0.985) set in advance in the control section 607.

Figure 23:
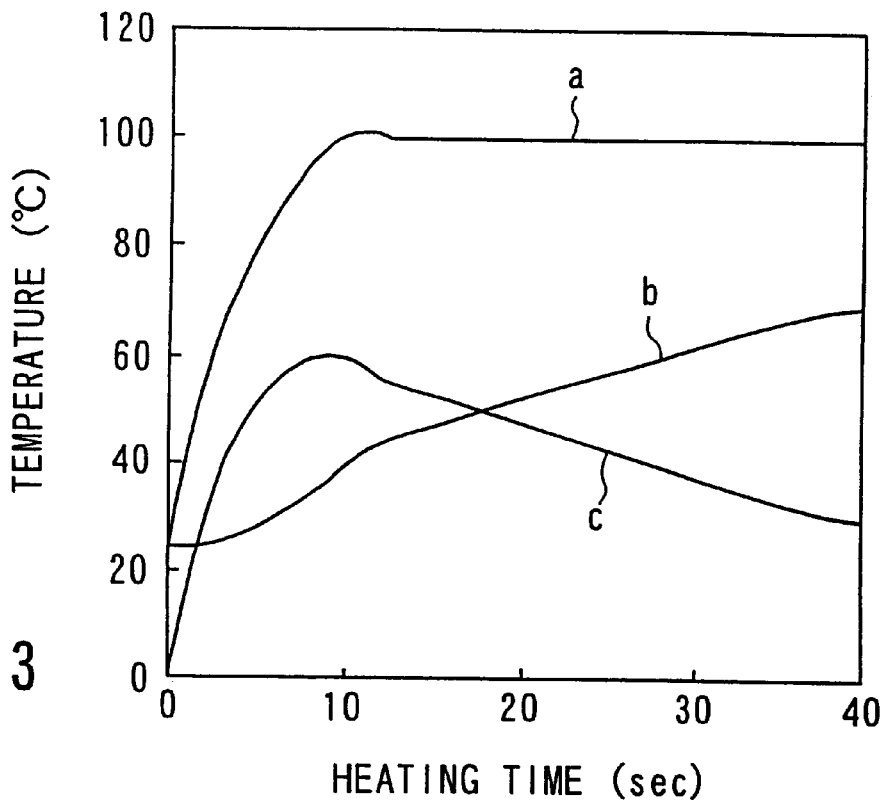
FIG. 23 is a graph showing the changes with the heating time in the temperatures of a target thin film to be heated and the quartz substrate as well as the temperature difference between the thin film and the substrate according to the fifth embodiment of the present invention.

FIG. 23 is a graph showing the change (a) of the temperature of the target thin film 601a, the change (b) of the temperature of the quartz substrate 601b, and the difference (c) between the temperatures of the target thin film 601a and the quartz substrate 601b. For 9.85 seconds after the voltage application, the heat treatment was performed under the state that the output was 100% (100V, 150 W). The temperature of the target thin film 601a was found to have reached 100° C. about 10.00 seconds later.

The voltage applied to the halogen lamp 603 after the time $t_a$ (=9.85 seconds) was obtained by using the formula:

$$V = D \times (T_1 - T_2) + E \times \{(\delta T_1/\delta t) - (\delta T_2/\delta t)\} \Delta t$$

Figure 24:
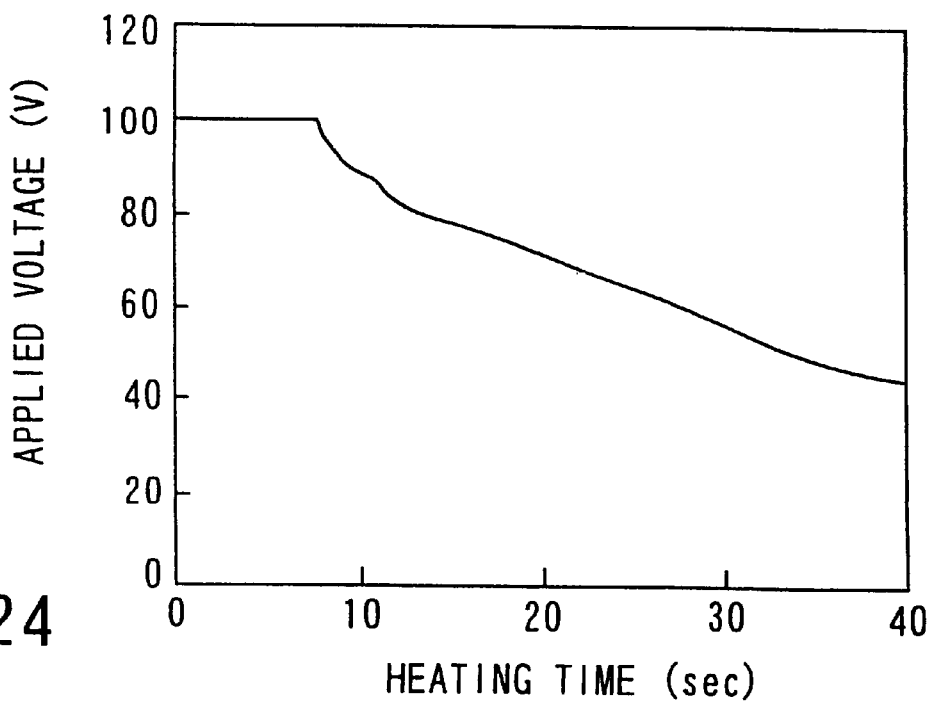
FIG. 24 is a graph showing the relationship between the voltage applied to a halogen lamp and the heating time according to the fifth embodiment of the present. invention.

D and E in the formula given above represents proportional constants. The applied voltage was calculated as required by using the formula given above so as to apply a suitable voltage to the halogen lamp 603. FIG. 24 shows the result. The reason for using the particular function is that, since a heat flow is generated in proportion to the difference between the temperature of the light shielding film (Cr film) and the photosensitive film (resist film) and the temperature of the quartz substrate, the surface temperature of the substrate is considered to be proportional to the heat flow under the state that an energy is kept supplied from the halogen lamp to the light shielding film and the photosensitive film.

As described above, the target substrate is heated in view of not only the temperature information of the light shielding film and the photosensitive film on the substrate surface but also the temperature information of the quartz substrate. As a result, it has been made possible to carry out the heat treatment under the set temperature $T_s \pm 0.2°$ C. with a very high accuracy both under the temperature elevated state ($T_1$, $T_2 < T_s$) and under a semi-stable state ($T_1 = T_s$, $T_2 < T_s$) without bringing about hunting or the like even by the heating utilizing the light irradiation having a very high response speed. Also, the temperature can be controlled with a high accuracy by independently controlling the temperature for each irradiating region of the halogen lamp.

The temperature of the target thin film 601a was kept at substantially 100° C. The voltage applied to the halogen lamp 603 was changed to a very low voltage 40 seconds after initiation of the heat treatment so as to stop the heat treatment of the substrate. As shown in FIG. 23, the temperature of the quartz substrate 601b when the heat treatment was stopped was about 70° C. The temperature of the resist film and the Cr film formed on the surface of the substrate was also dropped instantly to 70° C. as soon as the voltage applied to the halogen lamp was changed to a very low voltage.

After the heating was stopped, the target substrate 601 was transferred by the transfer arm 608 into a cleaning unit, and the substrate was cooled.

Then, a dip development was applied by using AD-10 (manufactured by Tama Kagaku K.K.), followed by applying a dry etching to the chromium film. Further, the resist film was peeled and the washing was performed, followed by measuring the size of the chromium pattern within the mask plane (130 mm square) by using an SEM. The planar uniformity of the size of the chromium pattern was found to be 9.8 nm (3σ), supporting that it was possible to obtain a chromium pattern excellent in uniformity.

[Sixth Embodiment]

Figure 25:
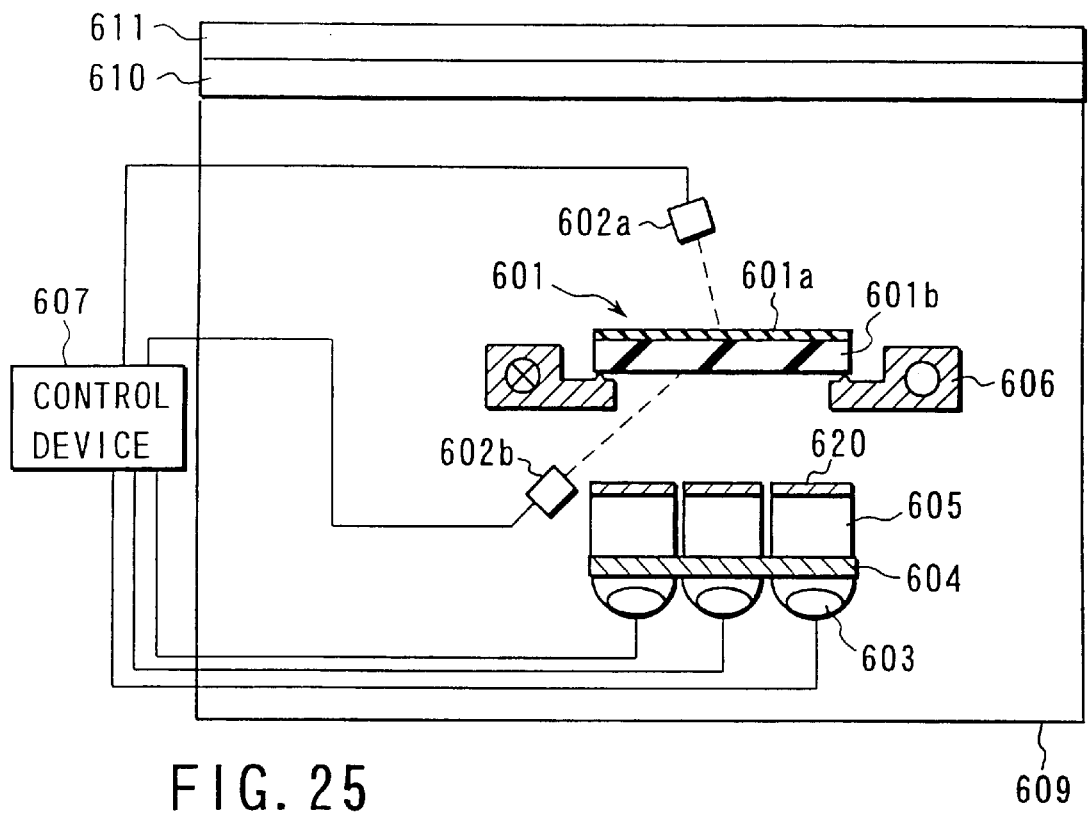
FIG. 25 schematically shows the construction of a heat treating apparatus according to a sixth embodiment of the present invention.

A sixth embodiment of the present invention will now be described with reference to FIG. 25, which is directed to a trial manufacture of a chromium mask used in a manufacturing process of a semiconductor device.

The basic construction of the apparatus is equal to that of the apparatus shown in FIG. 1. In the apparatus shown in FIG. 25, the radiation thermometer 602b for detecting mainly the temperature information relating to the quartz substrate 601b is arranged below the target substrate 601.

The radiation thermometer 602b serves to detect the light components having a wavelength of 2 to 4.3 $\mu$m. Since the quartz substrate 601b is translucent to the light components of the wavelength noted above, it is possible to measure the temperature inside the quarts substrate (in the vicinity of the light shielding film). The radiation thermometer 602a serves to detect the light components having a wavelength of 8 to 14 $\mu$m, as in the fifth embodiment. It is possible to detect selectively the temperature of the quartz substrate alone by arranging the radiation thermometer 602b below the target substrate 601 and by setting appropriately the wavelength of the light component detected by the radiation thermometer 602b.

A PID control was employed for the control. The control section 607 has a function of calculating the PID constant for determining the output R(t) to the halogen lamp 603 on the basis of the temperature $T_1(t)$ of the target heating section 601a at the time t, which is obtained on the basis of the temperature information detected by the temperature detecting section 602a, and the temperature $T_2(t)$ of the quartz substrate 601b at the time t, which is obtained on the basis of the temperature information detected by the temperature detecting section 602b. The substrate treating temperature $T_s$ was set at 100° C. as in the fifth embodiment.

The PID constant, which is considered to be the best by experience, is inputted in the initial setting time. After initiation of the heating, the changes with time in temperatures of the target heating section 601a and the quartz substrate 601b are estimated by using the formulas $\{T_1(t)-T_2(t)\}$, $\{\delta T_1(t)/\delta t\}-\{\delta T_2(t)/\delta t\}$, $\{\delta^2 T_1(t)/\delta t^2\}$, and $\{\delta^2 T_2(t)/\delta t^2\}$ on the basis of the temperature $T_1(t)$ of the target heating section 601a and the temperature $T_2(t)$ of the quartz substrate 601b at the time t. The optimum PID constant is determined on the basis of the period and amplitude of the vibration obtained on the basis of the result of the estimation. Since the optimum PID constant is determined as required during the heating treatment, it is possible to perform the control with the optimum PID constant in accordance with the changes in temperature of the target heating section 601a and the quarts substrate 601b.

A target substrate 601 equal to that used in the fifth embodiment was disposed on the mask support section 606.

Figure 26:
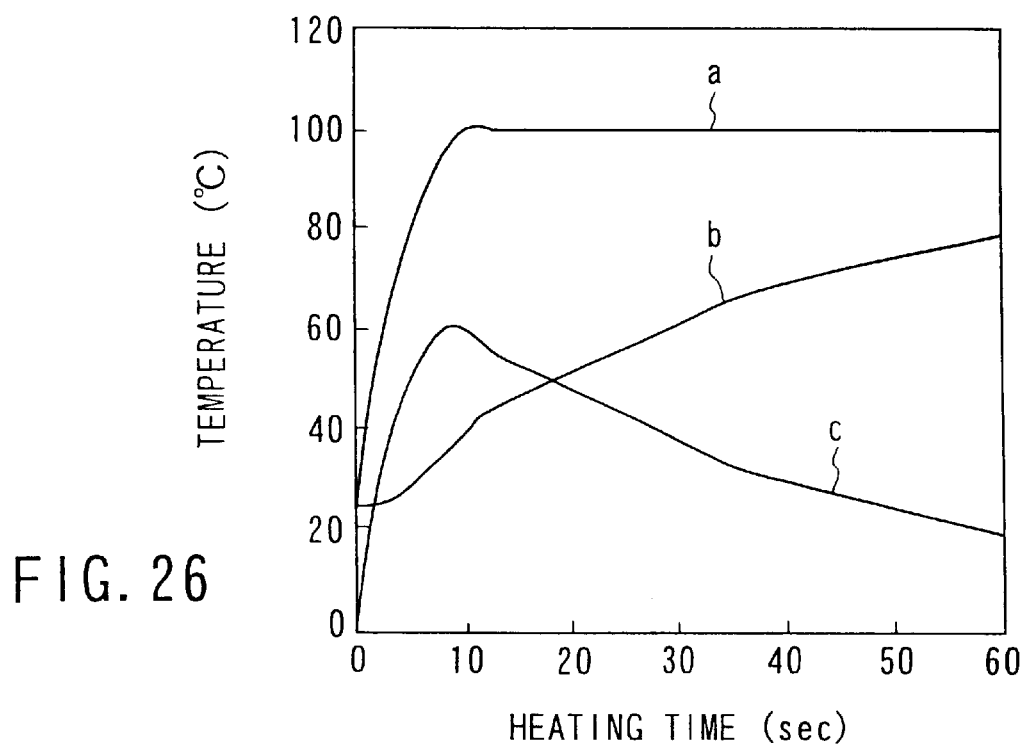
FIG. 26 is a graph showing the changes with the heating time in the temperatures of a target thin film to be heated and the quartz substrate as well as the temperature difference between the thin film and the substrate according to the sixth embodiment of the present invention.

The period for taking the temperature data was set at 10 msec, and the treating time was set at 60 sec. After the target substrate 601 was disposed on the mask support section 606, the heating treatment using the halogen lamp 603 was started. Also, the temperature data obtained by the radiation thermometers 602a and 602b were supplied to the control section 607. FIG. 26 is a graph showing the change (a) in temperature of the target thin film 601a, the change (b) in temperature of the quartz substrate, and the difference (c) between the temperature of the target thin film 601a and the temperature of the quartz substrate 1b.

Where the temperatures of the target thin film 601a and the quartz substrate 601b are lower than the set temperature $T_s$, i.e., $T_1$, $T_2 < T_s$, immediately after lighting of the lamp, the values of P=5 (%), I=4 (sec), and D=1 (sec) were inputted as default values as a combination of the control constants for the PID control.

The control constants for PID were changed in accordance with the temperature data of $T_1$ and $T_2$ as soon as the temperature $T_1$ of the target heating section 601a was changed to the set value ($T_1=T_s$) about 10 seconds after the lamp was lit so as to control the output of the halogen lamp.

As a result, it has been found that it is possible to carry out the heat treatment with a very high accuracy, i.e., at the set temperature $T_s \pm 0.2°$ C., under both the temperature elevated state ($T_1$, $T_2 < T_s$) and the semi-stable state ($T_1=T_s$, $T_2<T_s$) without giving rise to the hunting or an off-set error even in the system in which the response speed of the surface temperature is changed at all times. Also, it was possible to carry out the temperature control with a high accuracy by performing the temperature control independently for each irradiating region of the halogen lamp.

After the heating of the substrate was stopped, the target substrate 601 was transferred by using the transfer arm 608 into a cleaning unit, and the substrate was cooled.

Then, a dip development was performed, followed by applying a dry etching to the chromium film. Further, the resist film was peeled, and the washing was performed, followed by measuring the size of the chromium pattern by SEM within the mask plane (130 mm square). It has been found that the planar uniformity of the size of the chromium pattern was 9.8 nm (3δ), supporting that it is possible to obtain a chromium pattern excellent in uniformity.

In the sixth embodiment described above, the PID constant is calculated by estimating in advance the temperature. Alternatively, it is also possible to input in advance the PID constant that is considered to be the most appropriate in accordance with the temperature difference between the target heating section and the quartz substrate.

As described above, according to the fifth and sixth embodiments of the present invention, the heating section is controlled in view of the temperature $T_2$ of the base substrate in addition to the treating temperature $T_s$ of the thin film and the temperature $T_1$ of the thin film, making it possible to carry out the temperature with a high accuracy. In other words, it is possible to apply a heat treatment to a thin film with a high accuracy.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heat treating method for heating a target substrate by means of light irradiation, wherein a light irradiation treatment is applied to said target substrate such that the light irradiating regions of said target substrate do not overlap with each other, said light irradiation treatment being performed by using an irradiating light adjusted such that the distribution of the light intensity within the light irradiating region of the target substrate is rendered uniform.

2. The heat treating method according to claim 1, wherein the light irradiation treatment applied to the target substrate is performed by changing the light irradiating regions by a predetermined order such that the light irradiating regions do not overlap with each other.

3. The heat treating method according to claim 1, wherein the light irradiation treatment applied to the target substrate is performed by using a plurality of irradiating light generating sections arranged to conform with the light irradiating regions and arranged such that the light irradiating regions do not overlap with each other.

* * * * *